United States Patent
Lin et al.

(10) Patent No.: US 12,388,021 B2
(45) Date of Patent: Aug. 12, 2025

(54) SEMICONDUCTOR DEVICE AND METHOD

(71) Applicant: Taiwan Semiconductor Manufacturing Co., Ltd., Hsinchu (TW)

(72) Inventors: Wan-Hsien Lin, Hsinchu (TW); Ting-Gang Chen, Taipei (TW); Chin-Wei Lin, Taoyuan (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 570 days.

(21) Appl. No.: 17/743,849

(22) Filed: May 13, 2022

(65) Prior Publication Data
US 2023/0163075 A1    May 25, 2023

Related U.S. Application Data

(60) Provisional application No. 63/264,384, filed on Nov. 22, 2021.

(51) Int. Cl.
| | |
|---|---|
| *H01L 23/535* | (2006.01) |
| *H01L 21/768* | (2006.01) |
| *H01L 23/532* | (2006.01) |
| *H10D 30/01* | (2025.01) |
| *H10D 30/62* | (2025.01) |

(52) U.S. Cl.
CPC ...... *H01L 23/535* (2013.01); *H01L 21/76805* (2013.01); *H01L 21/76831* (2013.01); *H01L 21/76895* (2013.01); *H01L 23/53242* (2013.01); *H01L 23/53257* (2013.01); *H10D 30/024* (2025.01); *H10D 30/6211* (2025.01)

(58) Field of Classification Search
CPC .......... H01L 21/76831; H10D 64/017
See application file for complete search history.

(56) References Cited

U.S. PATENT DOCUMENTS

| | | |
|---|---|---|
| 9,105,490 B2 | 8/2015 | Wang et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |

(Continued)

FOREIGN PATENT DOCUMENTS

TW    202139296 A    10/2021

*Primary Examiner* — Shih Tsun A Chou
(74) *Attorney, Agent, or Firm* — Slater Matsil, LLP

(57) ABSTRACT

Methods for selectively depositing a metal layer over a gate structure and semiconductor devices formed by the same are disclosed. In an embodiment, a semiconductor device includes a channel region over a semiconductor substrate; a gate structure over the channel region; a gate spacer adjacent the gate structure; a first dielectric layer adjacent the gate spacer; a barrier layer contacting a top surface of the gate spacer and a side surface of the first dielectric layer, the barrier layer including a nitride; and a metal layer over the gate structure adjacent the barrier layer, the metal layer having a first width equal to a second width of the gate structure.

20 Claims, 34 Drawing Sheets

(56) References Cited

U.S. PATENT DOCUMENTS

| | | |
|---|---|---|
| 9,859,386 B2 | 1/2018 | Ho et al. |
| 2017/0077256 A1* | 3/2017 | Adusumilli .......... H10D 64/017 |
| 2020/0126843 A1* | 4/2020 | Tsai .................. H01L 21/76834 |
| 2021/0313181 A1 | 10/2021 | Chen et al. |

* cited by examiner

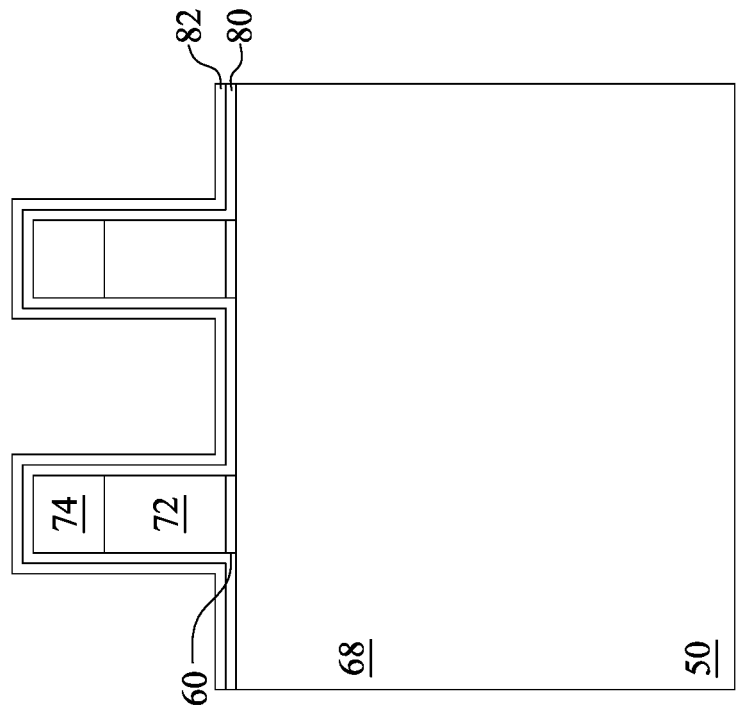
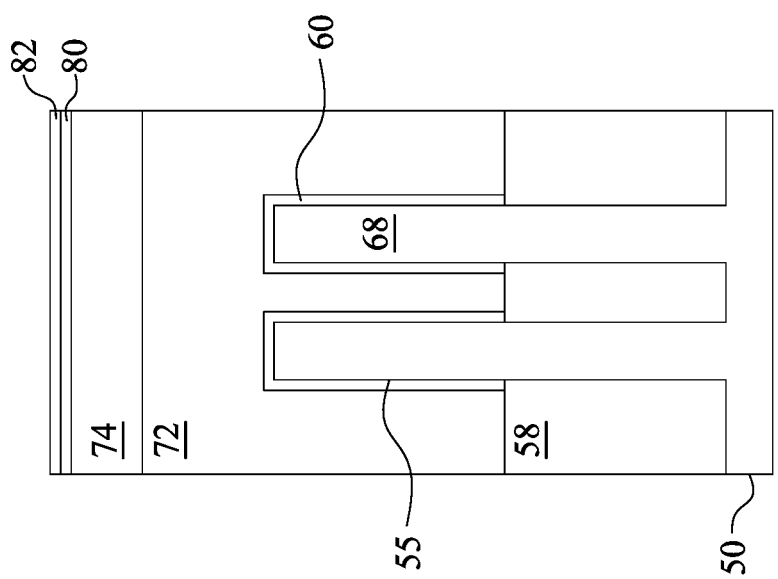
Fig. 7B
Fig. 7A

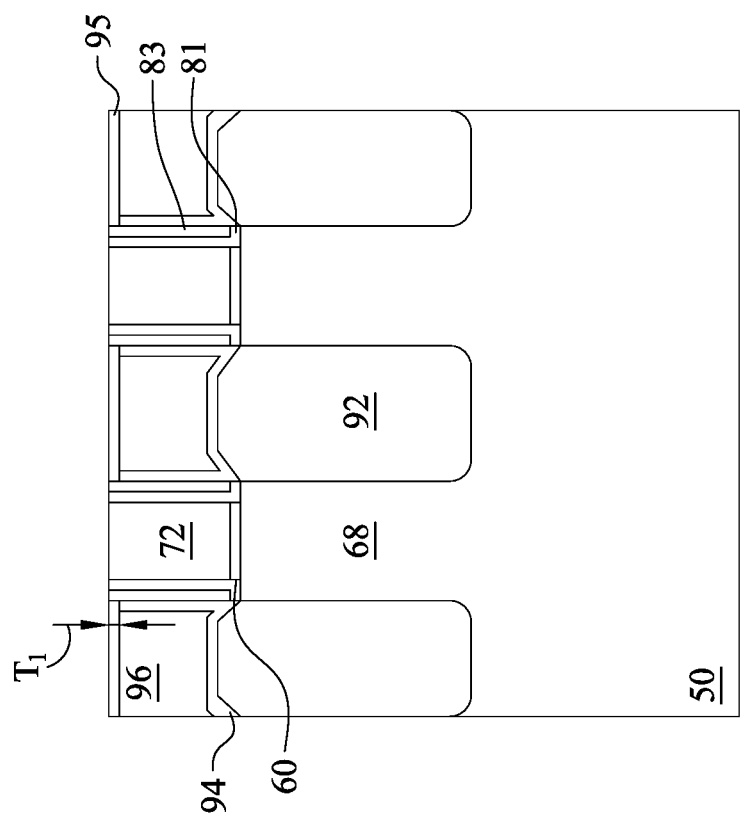

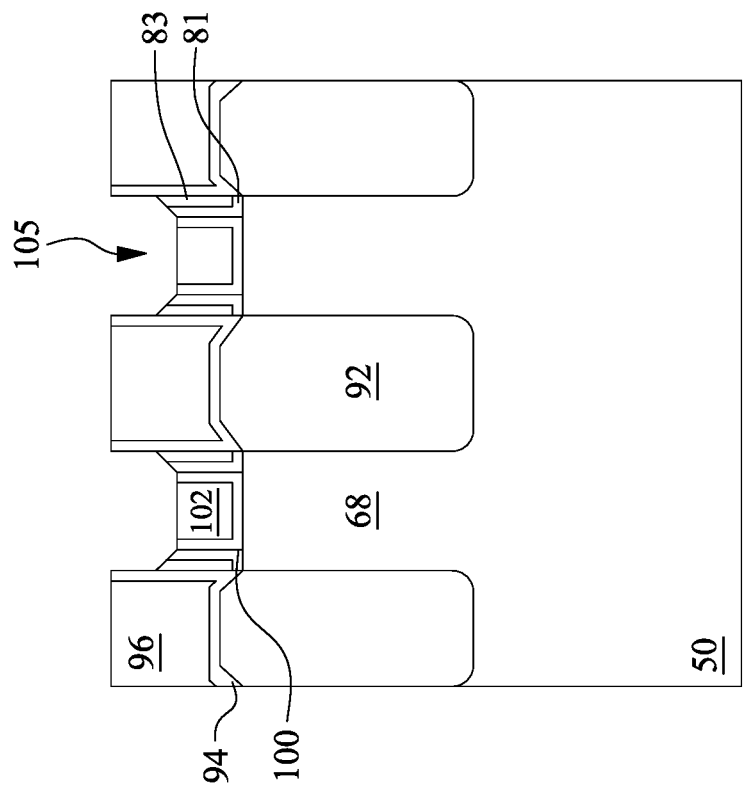
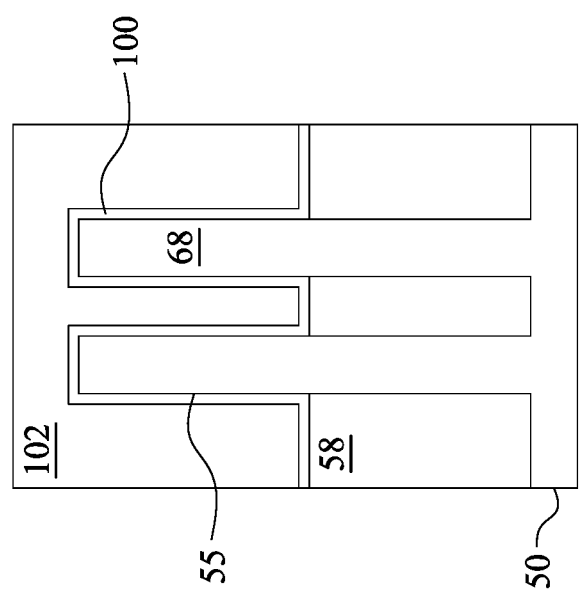
Fig. 15B
Fig. 15A

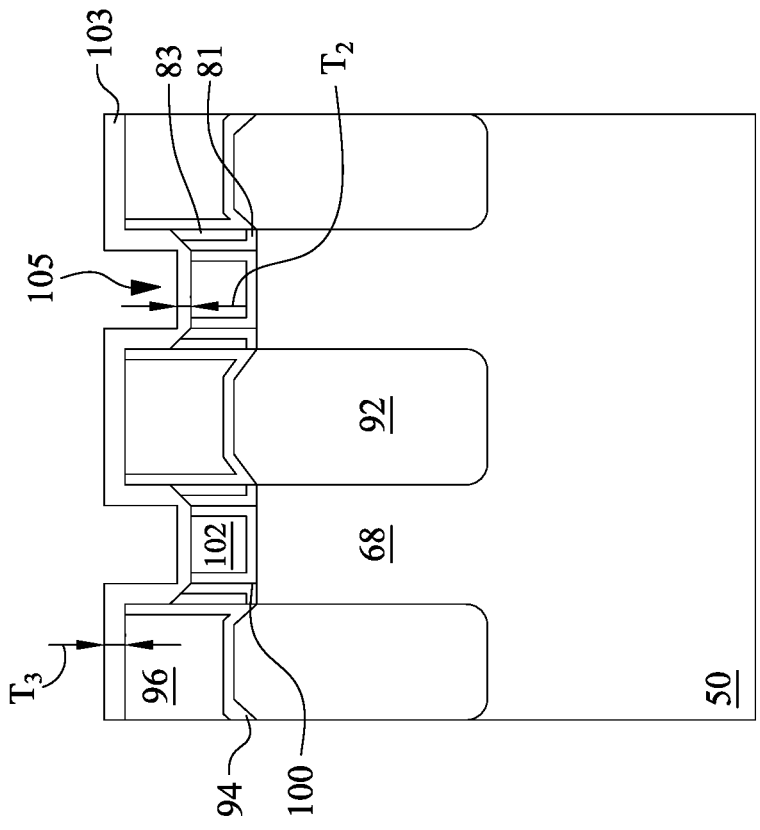
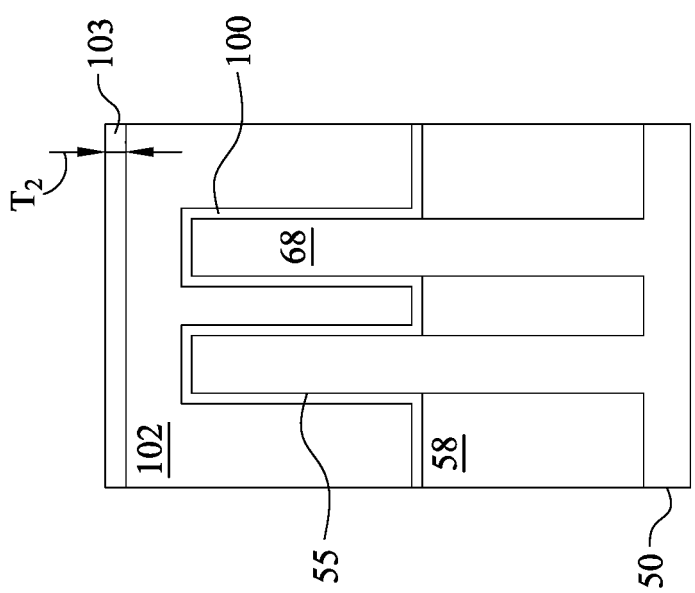
Fig. 16B
Fig. 16A

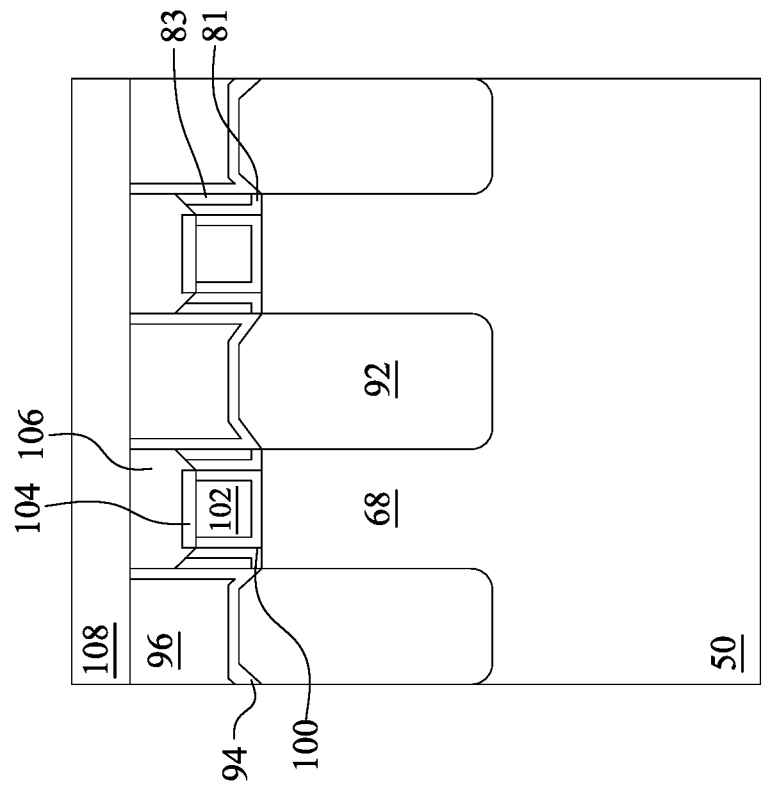
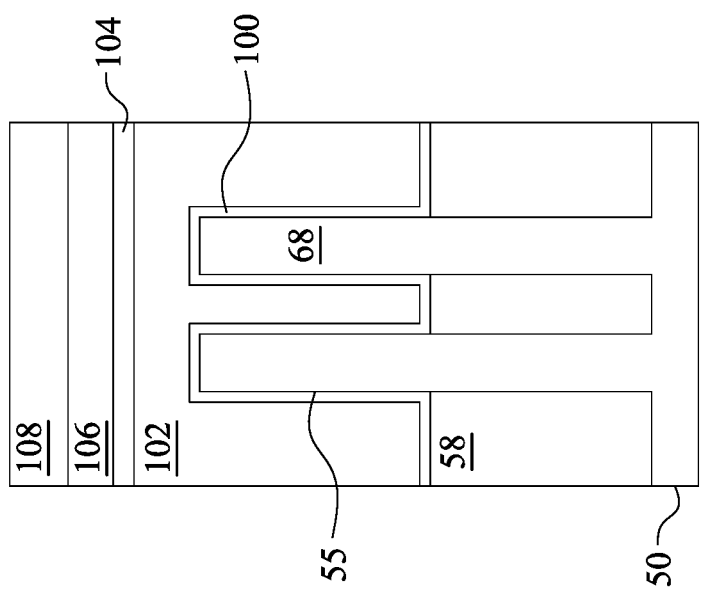
Fig. 20B
Fig. 20A

SEMICONDUCTOR DEVICE AND METHOD

PRIORITY CLAIM AND CROSS-REFERENCE

This application claims the benefit of U.S. Provisional Application No. 63/264,384, filed on Nov. 22, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 7A, 7B, 7C, 8A, 8B, 8C, 9A, 9B, 9C, 10A, 10B, 10C, 10D, 11A, 11B, 12A, 12B, 12C, 12D, 13A, 13B, 14A, 14B, 15A, 15B, 15C, 16A, 16B, 16C, 16D, 17A, 17B, 17C, 18A, 18B, 18C, 18D, 19A, 19B, 19C, 20A, 20B, 21A, and 21B are cross-sectional views of intermediate stages in the manufacturing of semiconductor devices, in accordance with some embodiments.

DETAILED DESCRIPTION

Figure 1:
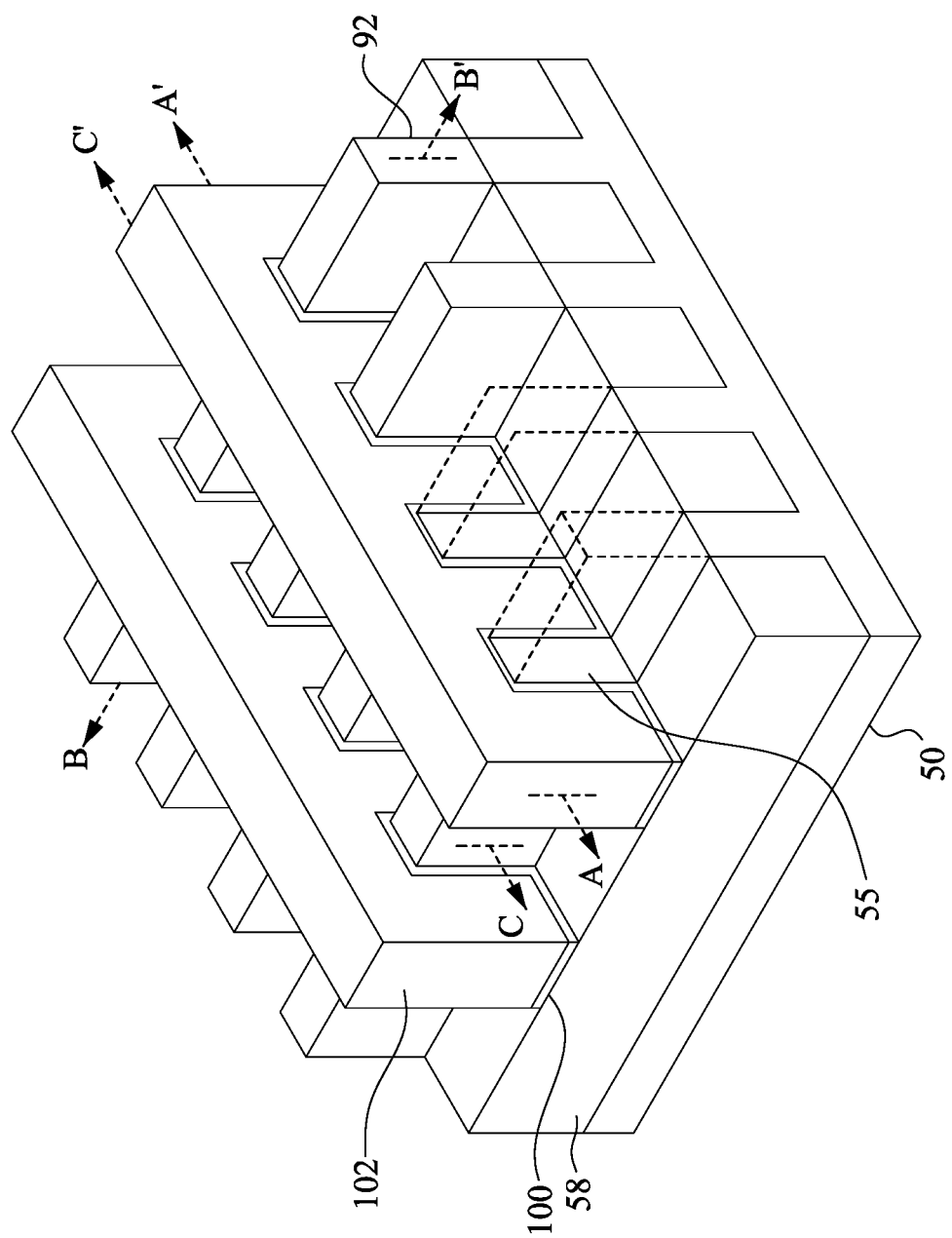
FIG. 1 illustrates an example of a semiconductor device including fin field-effect transistors (FinFETs) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide methods of selectively depositing a metal layer over a metal gate electrode and semiconductor devices formed by the same. The methods may include forming a barrier layer over various dielectric layers (e.g., an interlayer dielectric (ILD) layer and a contact etch stop layer (CESL)) and a metal gate. The barrier layer may include a nitride, such as silicon nitride (SiN), silicon oxygen nitride (SiON), silicon carbon nitride (SiCN), silicon oxygen carbon nitride (SiOCN), combinations or multiple layers thereof, or the like. The barrier layer is removed from over the metal gate and the metal layer is selectively deposited over the metal gate. In some embodiments, the metal layer may be deposited from metal chloride precursors, such as tungsten chloride ($WCl_5$), titanium chloride ($TiCl_3$), platinum chloride ($PtCl_6$); metal fluoride precursors, such as tungsten fluoride ($WF_6$); combinations or multiples thereof; or the like. Forming the barrier layer and selectively depositing the metal layer over the metal gate avoids deposition of the metal layer in undesired areas. Preventing undesired metal growth reduces leakage, reduces parasitic capacitance, reduces device defects, and improves device performance.

FIG. 1 illustrates an example of FinFETs in a three-dimensional view, in accordance with some embodiments. The FinFETs comprise fins 55 on a substrate 50 (e.g., a semiconductor substrate). Isolation regions 58 are disposed in the substrate 50, and the fins 55 protrude above and from between neighboring isolation regions 58. Although the isolation regions 58 are described/illustrated as being separate from the substrate 50, as used herein the term "substrate" may be used to refer to just the semiconductor substrate or a semiconductor substrate inclusive of isolation regions. Additionally, although the fins 55 are illustrated as single, continuous materials with the substrate 50, the fins 55 and/or the substrate 50 may comprise a single material or a plurality of materials. In this context, the fins 55 refer to the portions extending between the neighboring isolation regions 58.

Gate dielectric layers 100 are along sidewalls and over top surfaces of the fins 55, and gate electrodes 102 are over the gate dielectric layers 100. Epitaxial source/drain regions 92 (e.g., source regions and/or drain regions) are disposed on opposite sides of the fins 55, the gate dielectric layers 100, and the gate electrodes 102. FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 92 of the FinFETs. Cross-section B-B' is perpendicular to cross-section A-A' and is along a longitudinal axis of a fin 55 and in a direction of, for example, the current flow between the epitaxial source/drain regions 92 of the FinFETs. Cross-section C-C' is parallel to cross-section A-A' and extends through the epitaxial source/drain regions 92 of the FinFETs. Subsequent figures refer to these reference cross-sections for clarity.

Some embodiments discussed herein are discussed in the context of FinFETs formed using a gate-last process. In some embodiments, a gate-first process may be used. Some embodiments contemplate aspects used in planar devices, such as planar FETs, nanostructure (e.g., nanosheet, nanowire, gate-all-around, or the like) field effect transistors (NSFETs), or the like.

FIGS. 2 through 21B are cross-sectional views of intermediate stages in the manufacturing of FinFETs, in accordance with some embodiments. FIGS. 2 through 5, 6A, 7A, 8A, 9A, 10A, 11A, 12A, 13A, 14A, 15A, 16A, 17A, 18A, 19A, 20A, and 21A are illustrated along reference cross-section A-A' illustrated in FIG. 1. FIGS. 6B, 7B, 8B, 9B, 10B, 11B, 12B, 12C, 12D, 13B, 14B, 15B, 15C, 16B, 16C, 16D, 17B, 17C, 18B, 18C, 18D, 19B, 19C, 20B, and 21B are illustrated along reference cross-section B-B' illustrated in FIG. 1. FIGS. 7C, 8C, 9C, 10C, and 10D are illustrated along reference cross-section C-C' illustrated in FIG. 1.

Figure 2:
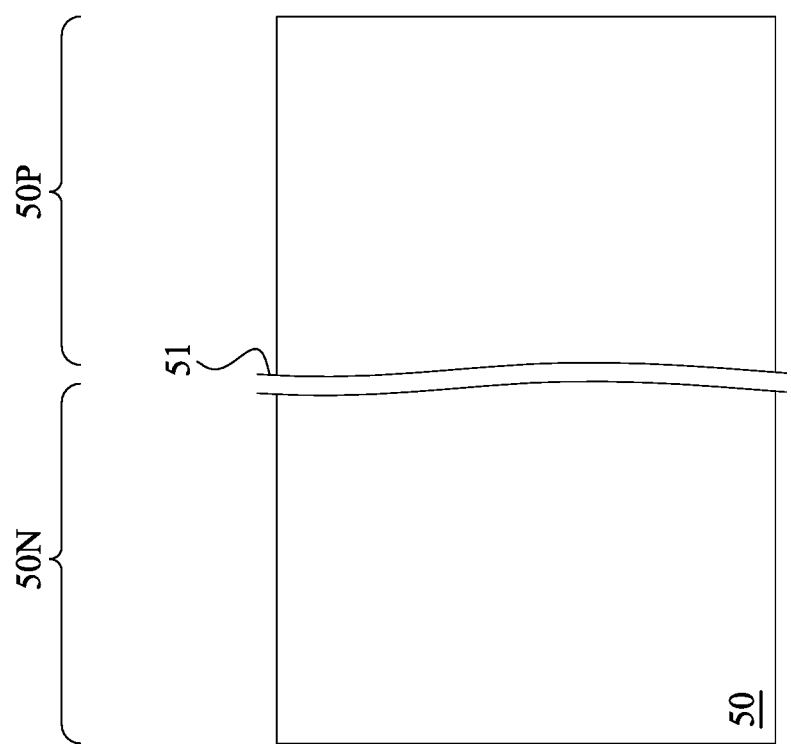

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or un-doped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 includes an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P (as illustrated by divider 51), and any number of device features (e.g., other active devices, doped regions, isolation structures, or the like) may be disposed between the n-type region 50N and the p-type region 50P.

Figure 3:
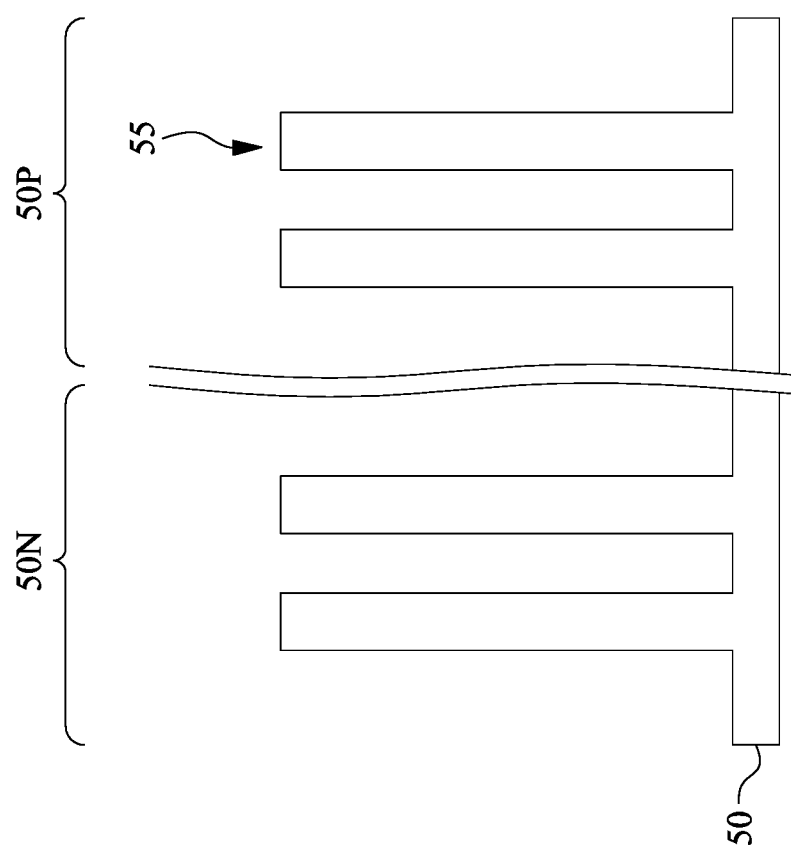

In FIG. 3, fins 55 are formed in the substrate 50. The fins 55 are semiconductor strips. In some embodiments, the fins 55 may be formed in the substrate 50 by etching trenches in the substrate 50. The etching may be any acceptable etch process, such as a reactive ion etch (RIE), a neutral beam etch (NBE), the like, or a combination thereof. The etching may be anisotropic.

The fins 55 may be patterned by any suitable method. For example, the fins 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 55. In some embodiments, the mask (or other layer) may remain on the fins 55. As illustrated in FIG. 3, the fins 55 may have substantially straight, vertical sidewalls. In some embodiments, at least portions of the fins 55 may have tapered sidewalls, which taper (e.g., narrow) in a direction away from the substrate 50.

Figure 4:
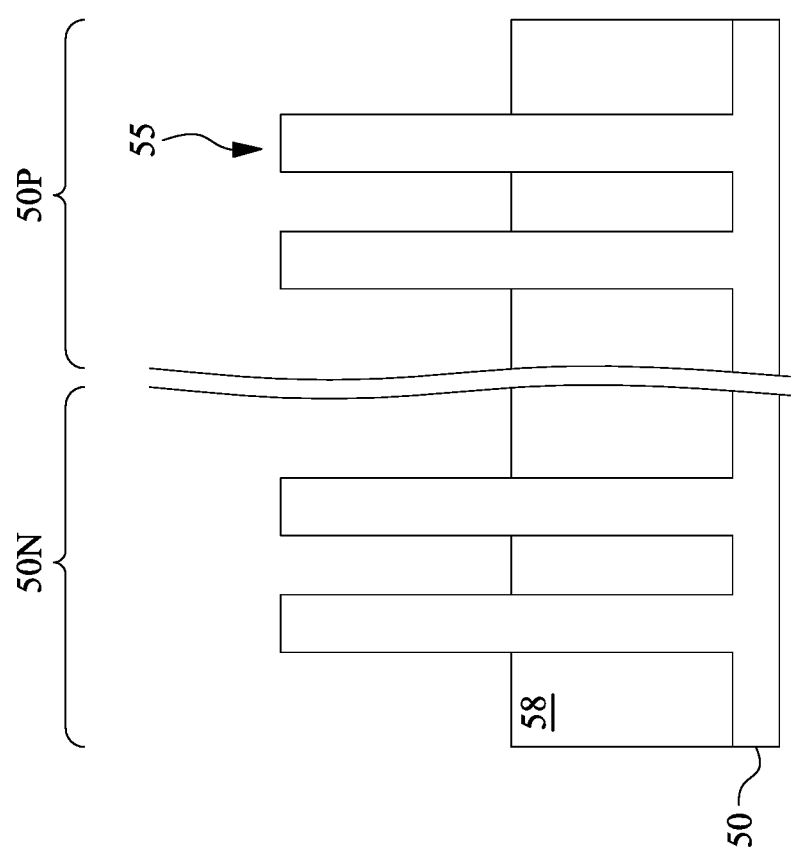

In FIG. 4, shallow trench isolation (STI) regions 58 are formed adjacent the fins 55. The STI regions 58 may be formed by forming an insulation material (not separately illustrated) over the substrate 50 and between neighboring fins 55. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system with post curing to convert the deposited material to another material, such as an oxide), the like, or a combination thereof. Other insulation materials formed by any acceptable process may be used. In the illustrated embodiment, the insulation material is silicon oxide formed by an FCVD process. An anneal process may be performed once the insulation material is formed. In some embodiments, the insulation material is formed such that excess insulation material covers the fins 55. The insulation material may comprise a single layer or may utilize multiple layers. For example, in some embodiments a liner (not separately illustrated) may first be formed along surfaces of the substrate 50 and the fins 55. Thereafter, a fill material, such as those discussed above may be formed over the liner.

A removal process is then applied to the insulation material to remove excess insulation material over the fins 55. In some embodiments, a planarization process such as a chemical mechanical polish (CMP), an etch-back process, combinations thereof, or the like may be utilized. The planarization process may planarize the insulation material and the fins 55. The planarization process exposes the fins 55 such that top surfaces of the fins 55 and the insulation material are level after the planarization process is complete.

The insulation material is then recessed to form the STI regions 58 as illustrated in FIG. 4. The insulation material is recessed such that upper portions of the fins 55 and the substrate 50 protrude from between neighboring STI regions 58. Further, the top surfaces of the STI regions 58 may have flat surfaces as illustrated, convex surfaces, concave surfaces (such as dishing), or a combination thereof. The top surfaces of the STI regions 58 may be formed flat, convex, and/or concave by an appropriate etch. The STI regions 58 may be recessed using an acceptable etching process, such as one that is selective to the material of the insulation material (e.g., etches the material of the insulation material at a faster rate than the material of the fins 55 and the substrate 50). For example, an oxide removal using, for example, dilute hydrofluoric (dHF) acid may be used.

The process described with respect to FIGS. 2 through 4 is just one example of how the fins 55 may be formed. In some embodiments, the fins 55 may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins 55. Additionally, in some embodiments, heteroepitaxial structures can be used for the fins 55. For example, the fins 55 in FIG. 4 can be recessed, and a material different from the fins 55 may be epitaxially grown over the recessed fins 55. In such embodiments, the fins 55 comprise the recessed material as well as the epitaxially grown material disposed over the recessed material. In some embodiments, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 55. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in the n-type region 50N (e.g., an NMOS region) different from the material in the p-type region 50P (e.g., a PMOS region). In some embodiments, upper portions of the fins 55 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 4, appropriate wells (not separately illustrated) may be formed in the fins 55 and/or the substrate 50. In some embodiments, a P well may be formed in the n-type region 50N, and an N well may be formed in the p-type region 50P. In some embodiments, a P well or an N well are formed in both the n-type region 50N and the p-type region 50P.

In the embodiments with different well types, the different implant steps for the n-type region 50N and the p-type region 50P may be achieved using a photoresist or other masks (not separately illustrated). For example, a photoresist may be formed over the fins 55 and the STI regions 58 in the n-type region 50N. The photoresist is patterned to expose the p-type region 50P of the substrate 50, such as a PMOS region. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N, such as an NMOS region. The n-type impurities may be phosphorus, arsenic, antimony, or the like implanted in the region to a concentration of equal to or less than $1\times10^{18}$ atoms/cm$^3$, such as between about $1\times10^{16}$ atoms/cm$^3$ and about $1\times10^{18}$ atoms/cm$^3$. After the implant, the photoresist is removed, such as by an acceptable ashing process.

Following the implanting of the p-type region 50P, a photoresist is formed over the fins 55 and the STI regions 58 in the p-type region 50P. The photoresist is patterned to expose the n-type region 50N of the substrate 50, such as the NMOS region. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P, such as the PMOS region. The p-type impurities may be boron, boron fluoride, indium, or the like implanted in the region to a concentration of equal to or less than $1\times10^{18}$ atoms/cm$^3$, such as between about $1\times10^{16}$ atoms/cm$^3$ and about $1\times10^{18}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
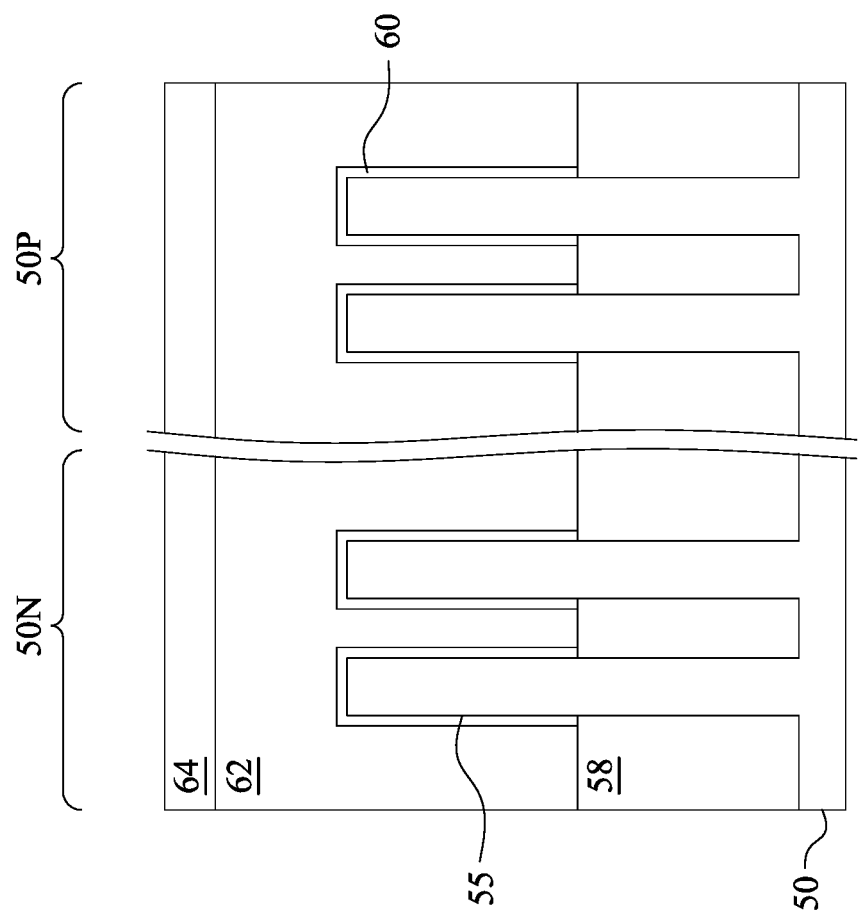

In FIG. 5, dummy dielectric layers 60 are formed on the fins 55 and the substrate 50. The dummy dielectric layers 60 may be, for example, silicon oxide, silicon nitride, a combination thereof, or the like, and may be deposited or thermally grown according to acceptable techniques. A dummy gate layer 62 is formed over the dummy dielectric layers 60, and a mask layer 64 is formed over the dummy gate layer 62. The dummy gate layer 62 may be deposited over the dummy dielectric layers 60 and then planarized by a process such as CMP. The mask layer 64 may be deposited over the dummy gate layer 62. The dummy gate layer 62 may be conductive or non-conductive materials and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing the selected material. The dummy gate layer 62 may be made of other materials that have a high etching selectivity from the material of the STI regions 58. The mask layer 64 may include, for example, silicon nitride, silicon oxynitride, or the like. In this example, a single dummy gate layer 62 and a single mask layer 64 are formed across the n-type region 50N and the p-type region 50P. It is noted that the dummy dielectric layers 60 are shown covering only the fins 55 and the substrate 50 for illustrative purposes only. In some embodiments, the dummy dielectric layers 60 may be deposited such that the dummy dielectric layers 60 cover the STI regions 58, extending between the dummy gate layer 62 and the STI regions 58.

FIGS. 6A through 21B illustrate various additional steps in the manufacturing of embodiment devices. FIGS. 6A through 21B illustrate features in either of the n-type region 50N or the p-type region 50P. For example, the structures illustrated in FIGS. 6A through 21B may be applicable to both the n-type region 50N and the p-type region 50P. Differences (if any) in the structures of the n-type region 50N and the p-type region 50P are described in the text accompanying each figure.

Figure 6A:
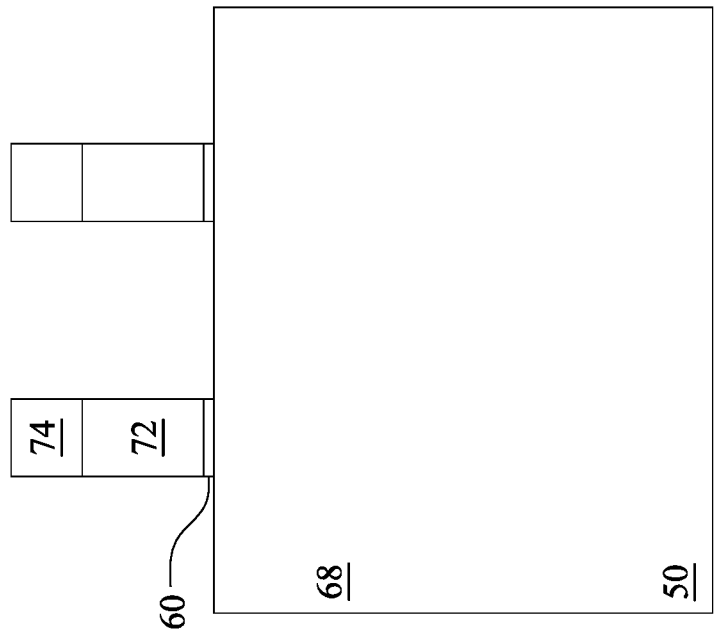
Figure 6B:
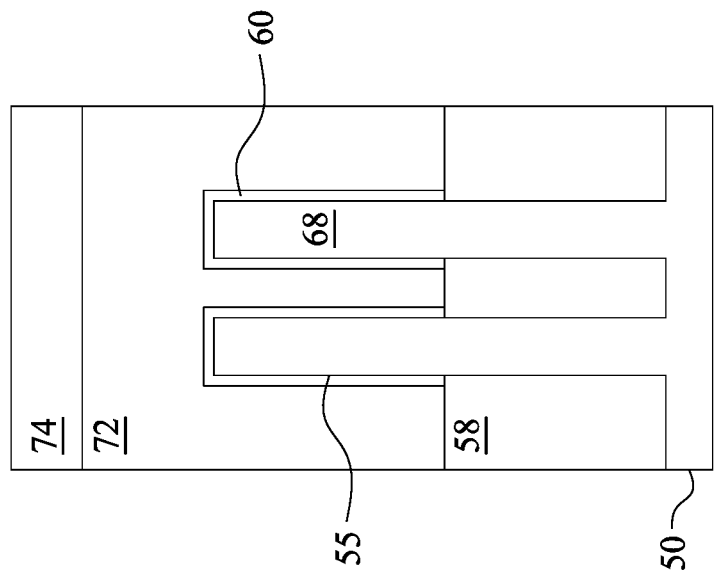

In FIGS. 6A and 6B, the mask layer 64 (see FIG. 5) may be patterned using acceptable photolithography and etching techniques to form masks 74. An acceptable etching technique may be used to transfer the pattern of the masks 74 to the dummy gate layer 62 to form dummy gates 72. In some embodiments, the pattern of the masks 74 may also be transferred to the dummy dielectric layers 60. The dummy gates 72 cover respective channel regions 68 of the fins 55. The pattern of the masks 74 may be used to physically separate each of the dummy gates 72 from adjacent dummy gates. The dummy gates 72 may also have a lengthwise direction substantially perpendicular to the lengthwise direction of respective fins 55. The dummy dielectric layers 60, the dummy gates 72, and the masks 74 may be collectively referred to as "dummy gate stacks."

Figure 7C:
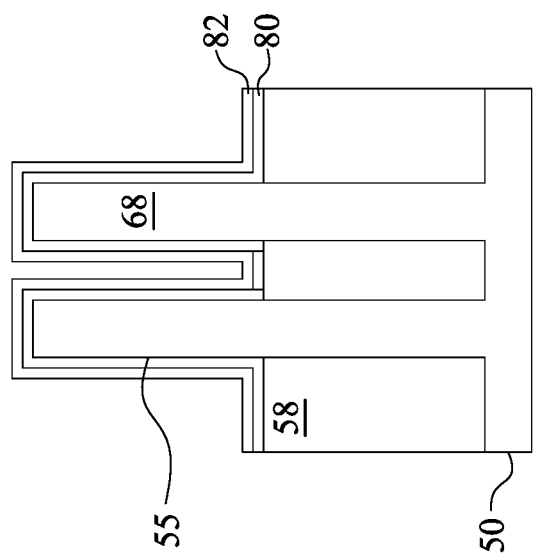

In FIGS. 7A through 7C, a first spacer layer 80 and a second spacer layer 82 are formed over the structures illustrated in FIGS. 6A and 6B. In FIGS. 7A through 7C, the first spacer layer 80 is formed on top surfaces of the STI regions 58, top surfaces and sidewalls of the fins 55 and the masks 74, and sidewalls of the dummy gates 72 and the dummy dielectric layers 60. The second spacer layer 82 is deposited over the first spacer layer 80. The first spacer layer 80 may be formed by thermal oxidation or deposited by CVD, ALD, or the like. The first spacer layer 80 may be formed of silicon oxide, silicon nitride, silicon oxynitride, or the like. The second spacer layer 82 may be deposited by CVD, ALD, or the like. The second spacer layer 82 may be formed of silicon oxide, silicon nitride, silicon oxynitride, or the like.

Figure 8B:
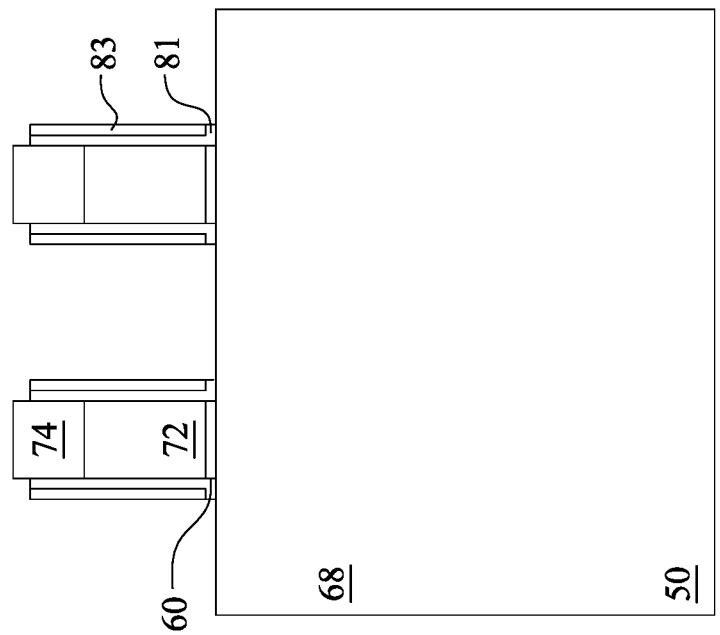
Figure 8A:
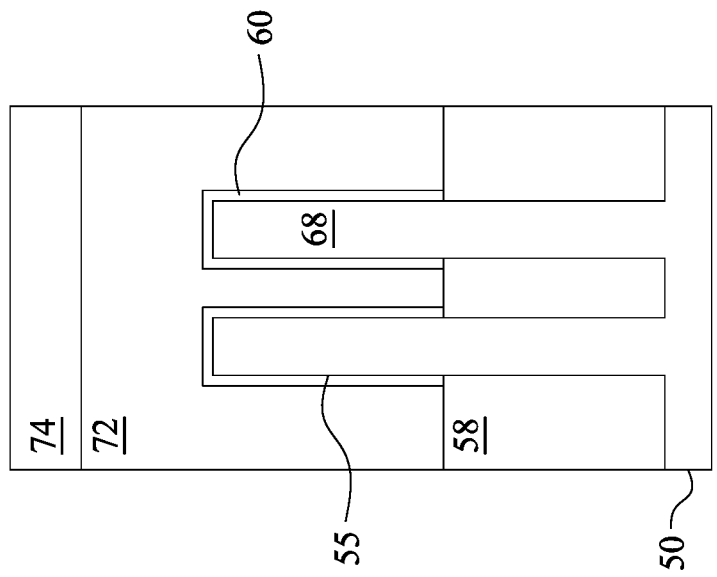
Figure 8C:
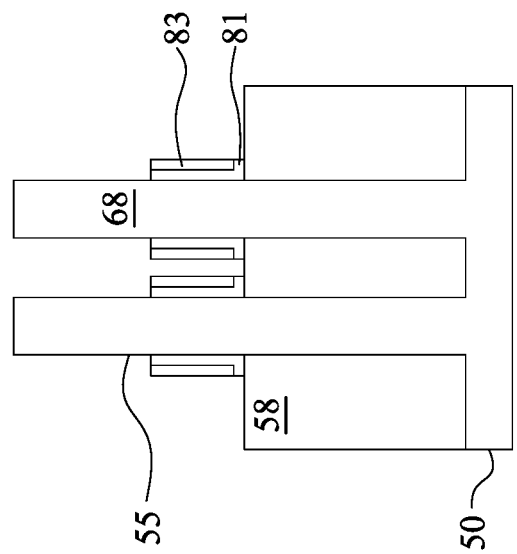

In FIGS. 8A through 8C, the first spacer layer 80 and the second spacer layer 82 are etched to form first spacers 81 and second spacers 83. The first spacer layer 80 and the second spacer layer 82 may be etched using a suitable etching process, such as an anisotropic etching process (e.g., a dry etching process) or the like. The first spacers 81 and the second spacers 83 may be disposed on sidewalls of the fins 55, the dummy dielectric layers 60, the dummy gates 72, and the masks 74. The first spacers 81 and the second spacers 83 may have different heights adjacent the fins 55 and the dummy gate stacks due to the etching processes used to etch the first spacer layer 80 and the second spacer layer 82, as well as different heights between the fins 55 and the dummy gate stacks. Specifically, as illustrated in FIGS. 8B and 8C, in some embodiments, the first spacers 81 and the second spacers 83 may extend partially up sidewalls of the fins 55 and the dummy gate stacks. In some embodiments, the first spacers 81 and the second spacers 83 may extend to top surfaces of the dummy gate stacks.

After the first spacers 81 and the second spacers 83 are formed, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 55 and the substrate 50 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 55 and the substrate 50 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $1 \times 10^{15}$ atoms/cm$^3$ to about $1 \times 10^{19}$ atoms/cm$^3$. An anneal may be used to repair implant damage and to activate the implanted impurities.

It is noted that the above disclosure generally describes a process of forming spacers and LDD regions. Other processes and sequences may be used. For example, fewer or additional spacers may be utilized, different sequence of steps may be utilized (e.g., the first spacers 81 may be formed prior to forming the second spacers 83, additional spacers may be formed and removed, and/or the like). Furthermore, the n-type and p-type devices may be formed using a different structures and steps.

Figure 9B:
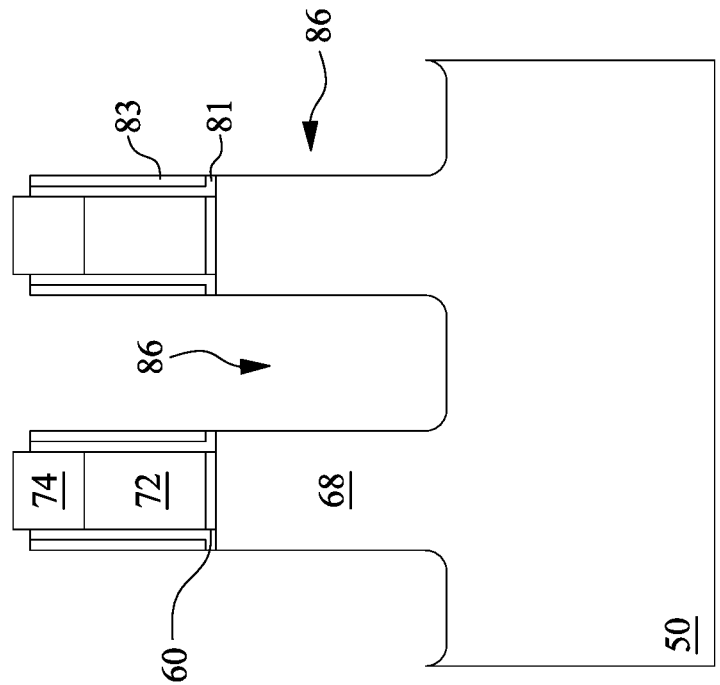
Figure 9A:
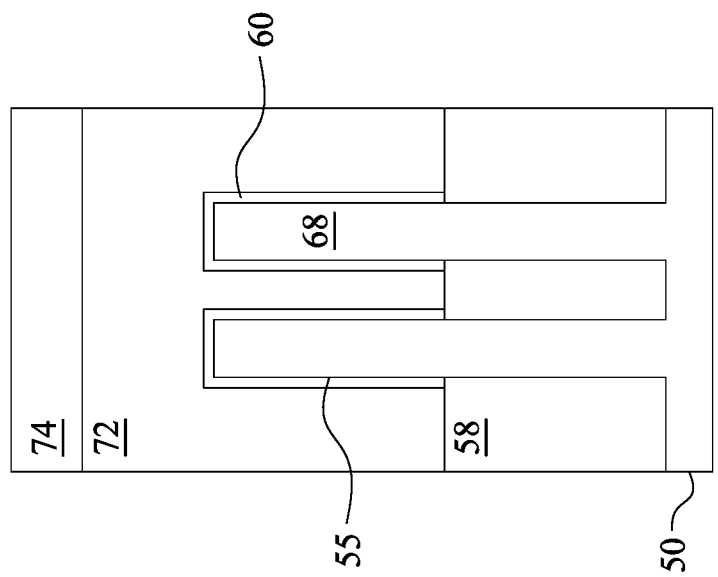
Figure 9C:
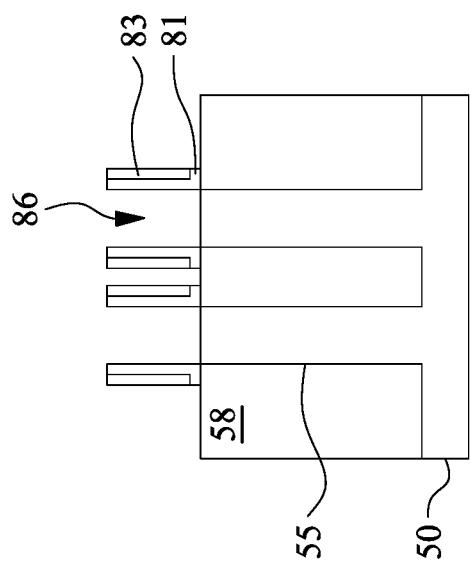

In FIGS. 9A through 9C, the substrate 50 and the fins 55 are etched to form first recesses 86. As illustrated in FIG. 9C, top surfaces of the STI regions 58 may be level with top surfaces of the fins 55. In some embodiments, bottom surfaces of the first recesses 86 are disposed above or below the top surfaces of the STI regions 58. The substrate 50/fins 55 are etched using anisotropic etching processes, such as RIE, NBE, or the like. The first spacers 81, the second spacers 83, and the masks 74 mask portions of the substrate 50/fins 55 during the etching processes used to form the first recesses 86. A single etch process or multiple etch processes may be used to form the first recesses 86. Timed etch processes may be used to stop the etching of the first recesses 86 after the first recesses 86 reach a desired depth.

Figure 10B:
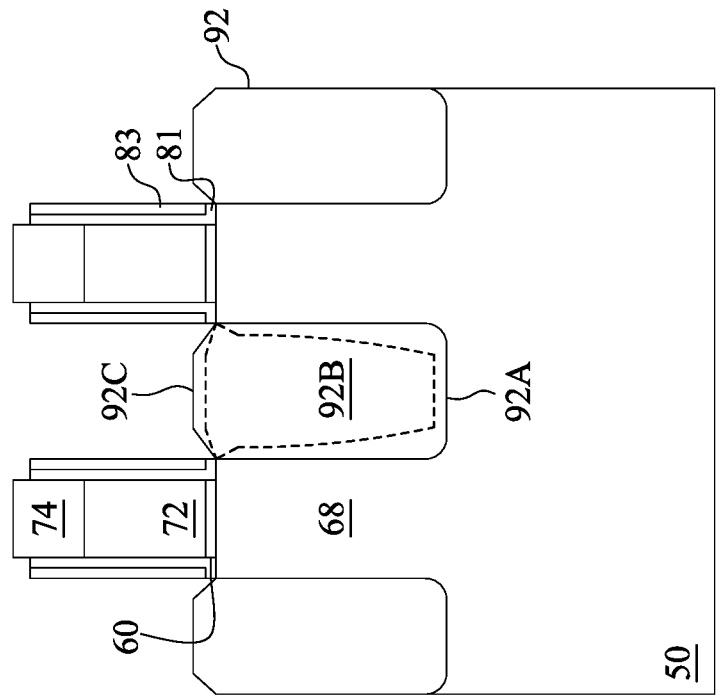

In FIGS. 10A through 10D, epitaxial source/drain regions 92 (e.g., source regions and/or drain regions) are formed in the first recesses 86 to exert stress on the channel regions 68 of the fins 55, thereby improving performance. As illustrated in FIG. 10B, the epitaxial source/drain regions 92 are formed in the first recesses 86 such that each dummy gate 72 is disposed between respective neighboring pairs of the epitaxial source/drain regions 92. In some embodiments, the first spacers 81 are used to separate the epitaxial source/drain regions 92 from the dummy gates 72 by an appropriate lateral distance so that the epitaxial source/drain regions 92 do not short out subsequently formed gates of the resulting FinFETs.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 86. The epitaxial source/drain regions 92 may include any acceptable material, such as appropriate for n-type FinFETs. For example, if the fins 55 are silicon, the epitaxial source/drain regions 92 may include materials exerting a tensile strain on the fins 55, such as silicon, silicon carbide, phosphorous doped silicon carbide, silicon phosphide, or the like. The epitaxial source/drain regions 92 may have surfaces raised from respective surfaces of the fins 55 and may have facets.

The epitaxial source/drain regions 92 in the p-type region 50P, e.g., the PMOS region, may be formed by masking the n-type region 50N, e.g., the NMOS region. Then, the epitaxial source/drain regions 92 are epitaxially grown in the first recesses 86. The epitaxial source/drain regions 92 may include any acceptable material, such as appropriate for p-type NSFETs. For example, if the fins 55 are silicon, the epitaxial source/drain regions 92 may comprise materials exerting a compressive strain on the fins 55, such as silicon-germanium, boron doped silicon-germanium, germanium, germanium tin, or the like. The epitaxial source/drain regions 92 may also have surfaces raised from respective surfaces of the fins 55 and may have facets.

The epitaxial source/drain regions 92, the fins 55, and/or the substrate 50 may be implanted with dopants to form source/drain regions, similar to the process previously discussed for forming lightly-doped source/drain regions, followed by an anneal. The source/drain regions may have an impurity concentration of between about $1 \times 10^{19}$ atoms/cm$^3$ and about $1 \times 10^{21}$ atoms/cm$^3$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the fins 55. In some embodiments, these facets cause adjacent epitaxial source/drain regions 92 of a same FinFET to merge as illustrated by FIG. 10C. In some embodiments, adjacent epitaxial source/drain regions 92 remain separated after the epitaxy process is completed as illustrated by FIG. 10D. In the embodiments illustrated in FIGS. 10C and 10D, the first spacers 81 may be formed covering portions of the sidewalls of the fins 55 that extend above the STI regions 58 thereby blocking the epitaxial growth. In some embodiments, the spacer etch used to form the first spacers 81 may be adjusted to remove the spacer material to allow the epitaxially grown region to extend to the surface of the STI region 58.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and/or may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 10A:
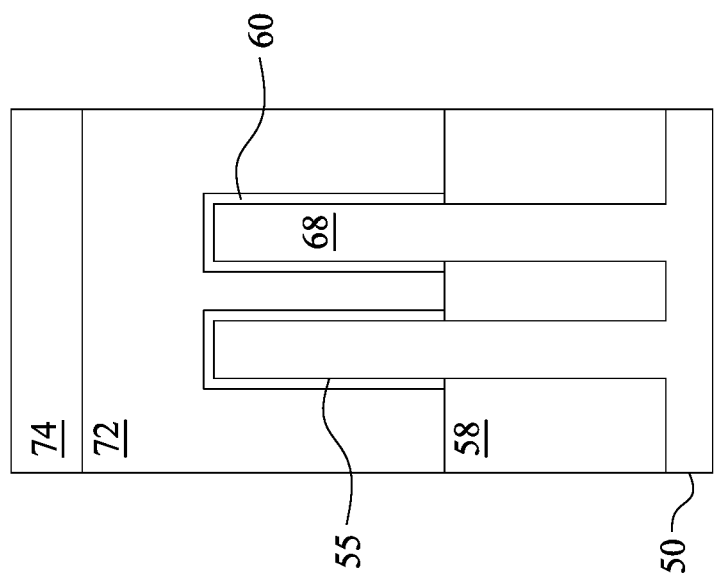
Figure 10C:
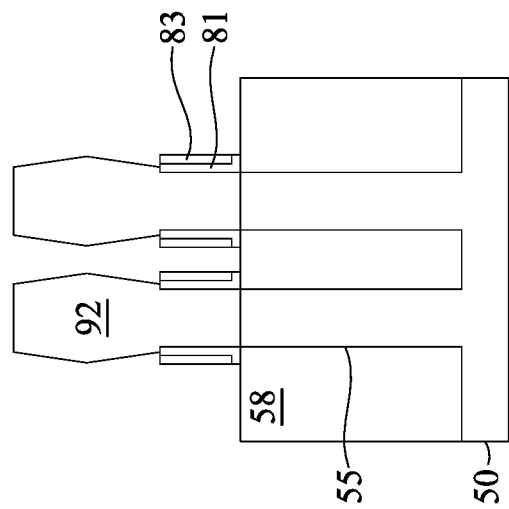
Figure 10D:
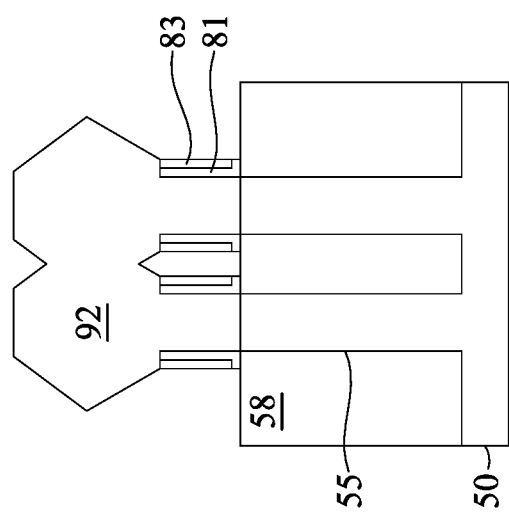
Figure 11B:
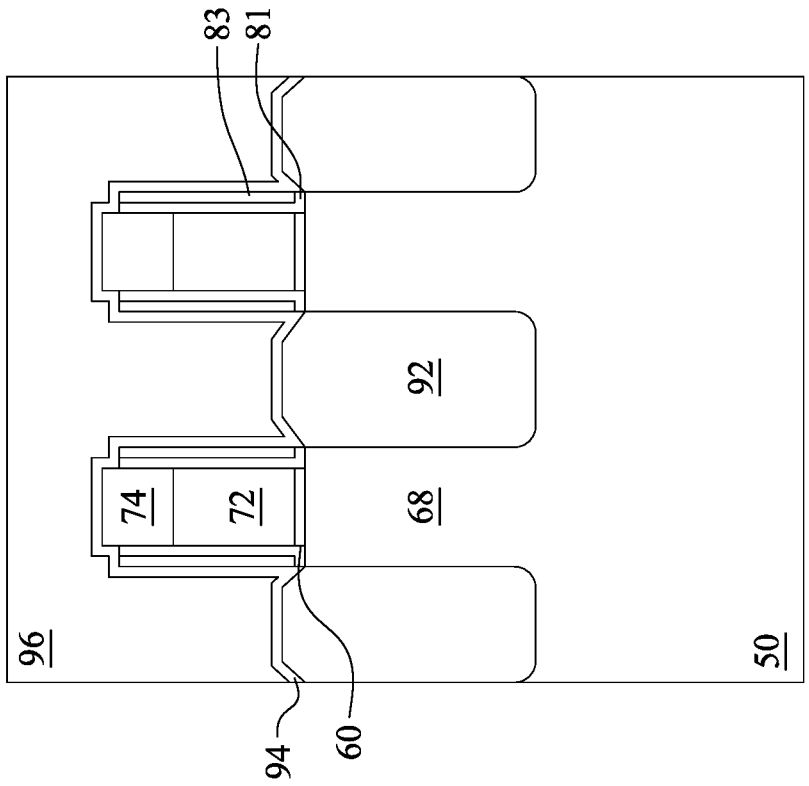
Figure 11A:
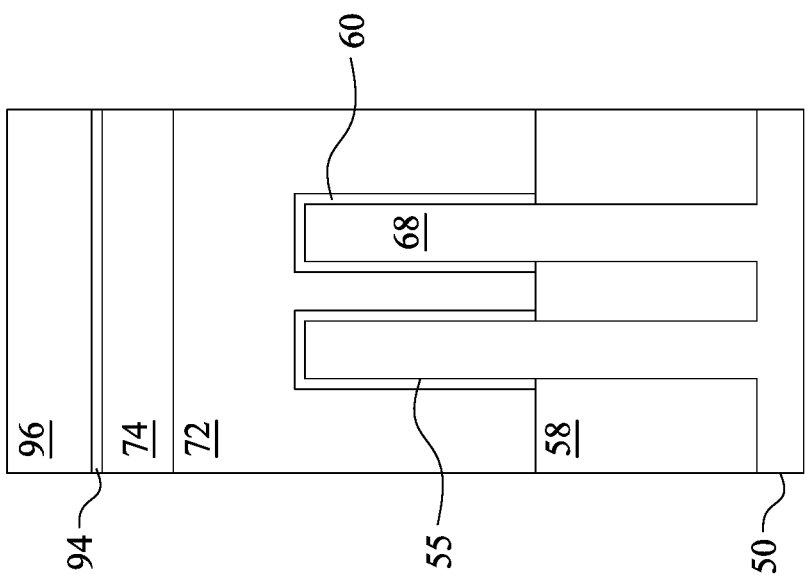

In FIGS. 11A and 11B, a first interlayer dielectric (ILD) 96 is deposited over the structure illustrated in FIGS. 10A and 10B, respectively. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. In some embodiments, the dielectric materials for the first ILD 96 may include silicon oxide, silicon nitride, silicon oxynitride, or the like. Other insulation materials formed by any acceptable process may be used. In some embodiments, a first contact etch stop layer (CESL) 94 is disposed between the first ILD 96 and the epitaxial source/drain regions 92, the masks 74, and the first spacers 81. The first CESL 94 may comprise a dielectric material, such as, silicon nitride, silicon oxide, silicon oxynitride, or the like, having a different etch rate than the material of the overlying first ILD 96. In some embodiments, the first ILD 96 may be formed of silicon oxide or silicon nitride and the first CESL 94 may be formed of silicon oxide or silicon nitride.

In FIGS. 12A through 12D, a planarization process, such as a CMP, may be performed to level the top surface of the first ILD 96 with the top surfaces of the dummy gates 72 or the masks 74. The planarization process may also remove the masks 74 on the dummy gates 72, and portions of the first spacers 81 along sidewalls of the masks 74. After the planarization process, top surfaces of the dummy gates 72, the first spacers 81, and the first ILD 96 are level. Accordingly, the top surfaces of the dummy gates 72 are exposed through the first ILD 96. In some embodiments, the masks 74 may remain, in which case the planarization process levels the top surface of the first ILD 96 with top surface of the masks 74 and the first spacers 81.

Figure 12B:
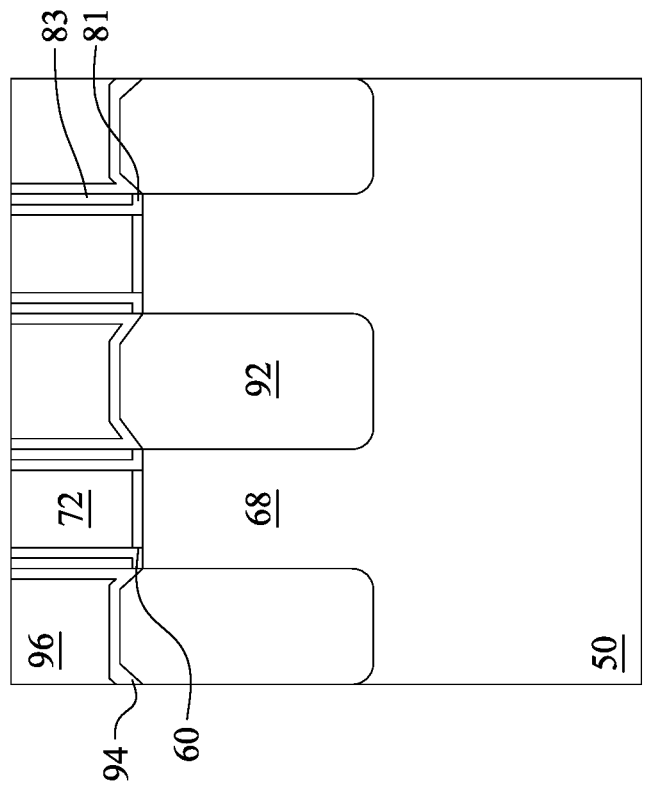
Figure 12A:
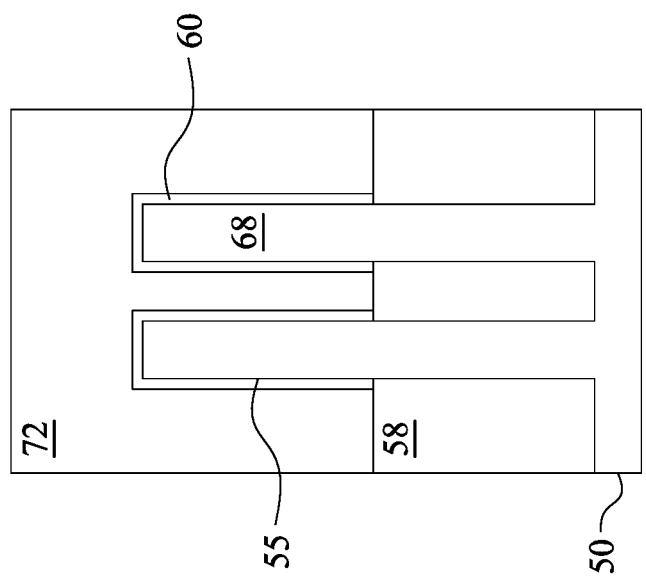
Figure 12D:
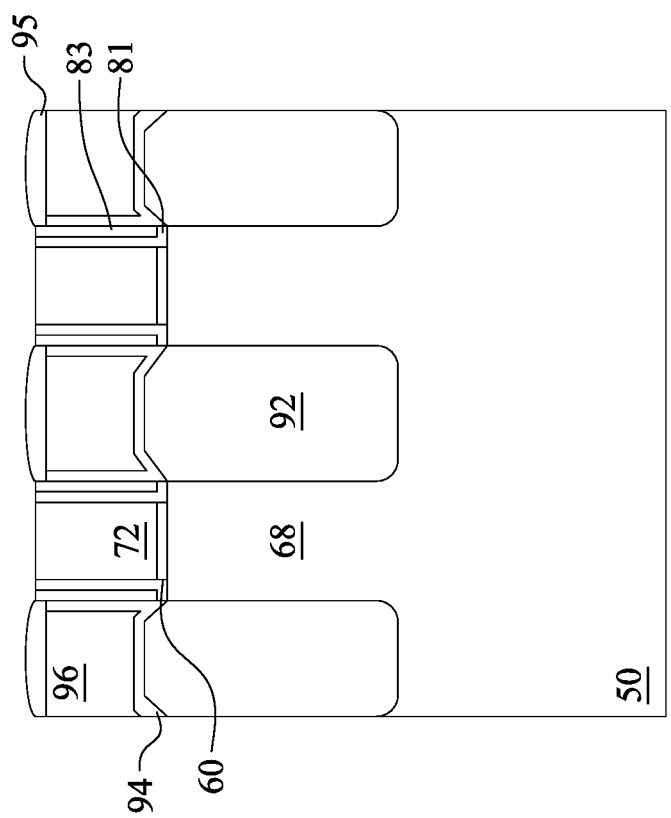

Further in FIGS. 12C and 12D, the first ILD 96 and the first CESL 94 are etched back and a protection layer 95 is formed over the first ILD 96 and the first CESL 94. The first ILD 96 and the first CESL 94 may be etched back using anisotropic etch processes, such as RIE, NBE, or the like, or isotropic etch process, such as wet etch processes. The protection layer 95 may then be deposited over the resulting structure using PVD, CVD, ALD, spin-on coating, or the like. In the embodiment illustrated in FIG. 12C, the protection layer 95 may be planarized using a process such as CMP. Top surfaces of the protection layer 95 may be level with top surfaces of the first spacers 81, the second spacers 83 and the dummy gates 76 following the planarization of the protection layer 95. In the embodiment illustrated in FIG. 12D, the protection layer 95 may be deposited with rounded top surfaces, which extend above top surfaces of the first spacers 81, the second spacers 83 and the dummy gates 76. The protection layer 95 may be formed of a material such as silicon nitride, silicon oxide, silicon oxycarbide, silicon oxycarbonitride, silicon carbonitride, combinations or multiple layers thereof, or the like. The protection layer 95 may be formed over the first ILD 96 and the first CESL 94 in order to protect the first ILD 96 and the first CESL 94 from subsequent etching processes. In some embodiments, the protection layer 95 may include the same materials as the first CESL 94. The protection layer 95 may have a thickness $T_1$ ranging from about 1 nm to about 5 nm. Providing the protection layer 95 with a thickness within the prescribed range provides sufficient material of the protection layer 95 to protect the underlying first ILD 96, without reducing the volume and insulating abilities of the first ILD 96.

Figure 13B:
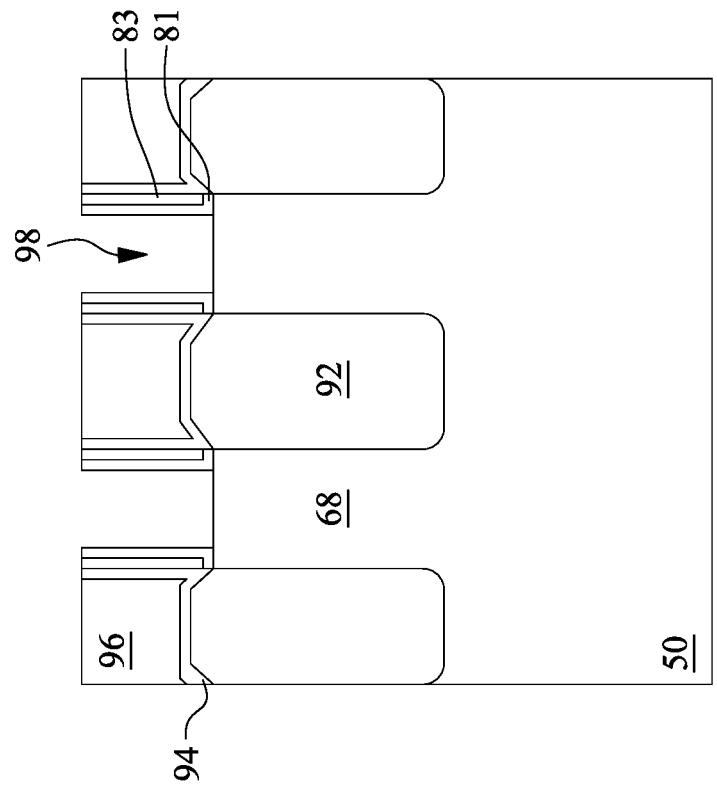
Figure 13A:
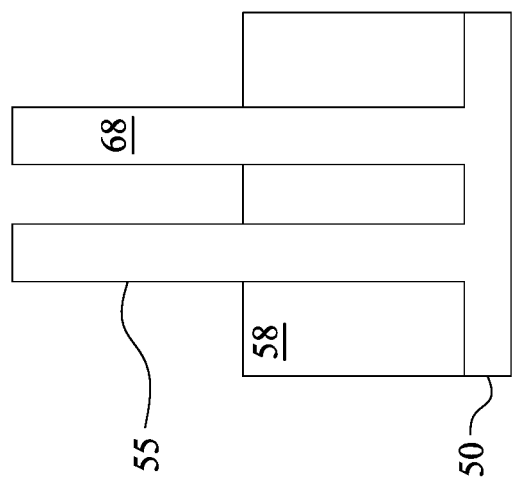

In FIGS. 13A and 13B, the dummy gates 72, and the masks 74 if present, are removed in an etching step(s), so that second recesses 98 are formed. Portions of the dummy dielectric layers 60 in the second recesses 98 may also be removed. In some embodiments, only the dummy gates 72 are removed and the dummy dielectric layers 60 remain and are exposed by the second recesses 98. In some embodiments, the dummy dielectric layers 60 are removed from second recesses 98 in a first region of a die (e.g., a core logic region) and remain in second recesses 98 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 at a faster rate than the first ILD 96 or the first spacers 81. Each of the second recesses 98 exposes and/or overlies a channel region 68 of a respective fin 55. Each channel region 68 is disposed between neighboring pairs of the epitaxial source/drain regions 92. During the removal, the dummy dielectric layers 60 may be used as etch stop layers when the dummy gates 72 are etched. The dummy dielectric layers 60 may be optionally removed after removing the dummy gates 72.

Figure 14B:
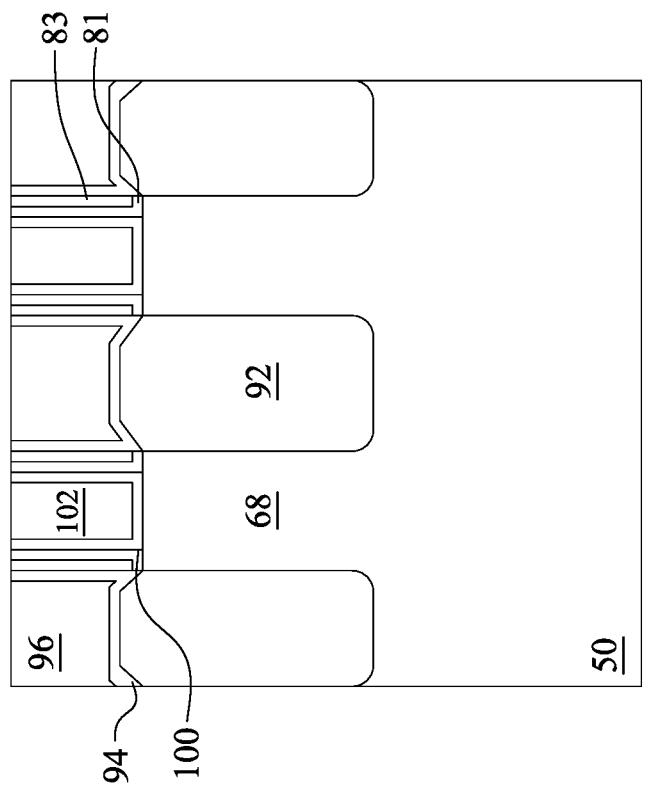
Figure 14A:
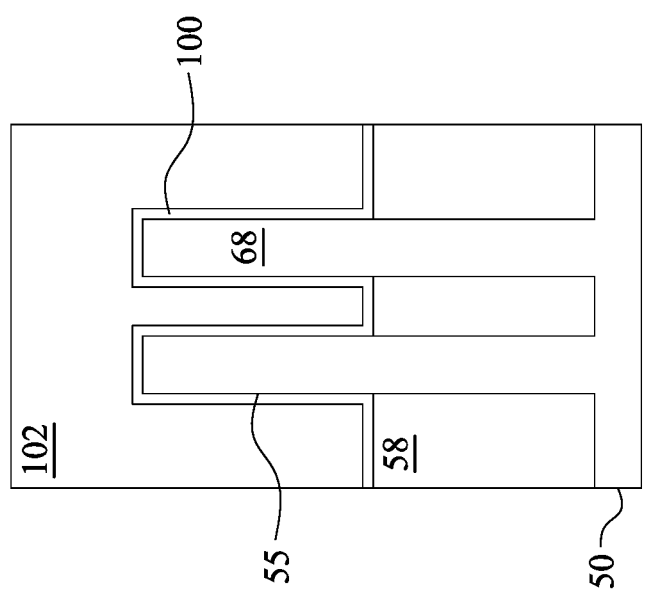

In FIGS. 14A and 14B, gate dielectric layers 100 and gate electrodes 102 are formed for replacement gates. The gate dielectric layers 100 may be formed by depositing one or more layers in the second recesses 98, such as on top surfaces and sidewalls of the fins 55, the first spacers 81, and on top surfaces of the STI regions 58, the second spacers 83 and the protection layer 95 or the first ILD 96 and the first CESL 94. The gate dielectric layers 100 may comprise one or more layers of silicon oxide ($SiO_x$), silicon nitride, metal oxides, metal silicates, or the like. For example, in some embodiments, the gate dielectric layers 100 include an interfacial layer of silicon oxide formed by thermal or chemical oxidation and an overlying high-k dielectric material, such as a metal oxide or a silicate of hafnium (e.g., $HfO_x$), aluminum, zirconium (e.g., $ZrO_x$), lanthanum, manganese, barium, titanium, lead, a combination thereof, or the like. The gate dielectric layers 100 may include dielectric layers having k-value greater than about 7.0. The gate dielectric layers 100 may be deposited by molecular-beam deposition (MBD), ALD, PECVD, or the like. In embodiments where portions of the dummy dielectric layers 60 remain in the second recesses 98, the gate dielectric layers 100 may include a material of the dummy dielectric layers 60 (e.g., $SiO_2$).

The gate electrodes 102 are deposited over the gate dielectric layers 100 and fill remaining portions of the second recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 102 is illustrated in FIGS. 14A and 14B, the gate electrodes 102 may comprise any number of liner layers, any number of work function tuning layers, and a fill material (not separately illustrated). After the filling of the second recesses 98, a planarization process, such as a CMP, is performed to remove excess portions of the gate dielectric layers 100 and the gate electrodes 102, which excess portions are over top surfaces of the first spacers 81, the second spacers 83, and the protection layer 95 or the first ILD 96 and the first CESL 94. The remaining portions of the gate electrodes 102 and the gate dielectric layers 100 form replacement gates of the resulting FinFETs. The gate electrodes 102 and the gate dielectric layers 100 may be collectively referred to as "gate stacks." The gate stacks may extend along sidewalls of the channel regions 68 of the fins 55.

The formation of the gate dielectric layers 100 in the n-type region 50N and the p-type region 50P may occur simultaneously such that the gate dielectric layers 100 in each region are formed from the same materials. The formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials. The gate electrodes 102 in each region may be formed by distinct processes, such that the gate electrodes 102 may be different materials. Various masking steps may be used to mask and expose appropriate regions when using distinct processes.

Figure 15C:
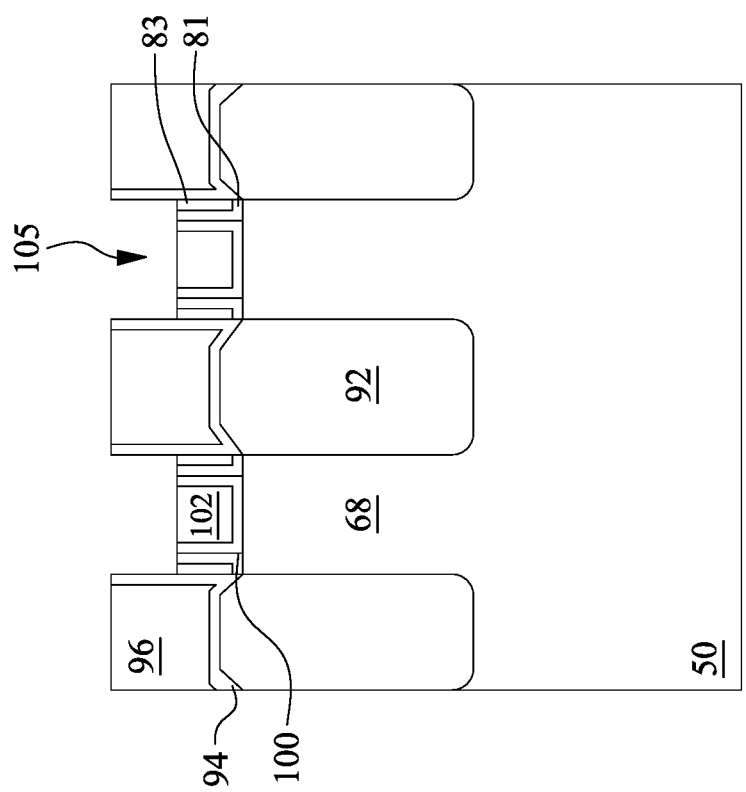

In FIGS. 15A through 15C, the gate structures (including the gate dielectric layers 100 and the corresponding overlying gate electrodes 102) are etched back to form recesses 105 directly over the gate structures and between opposing portions of first spacers 81. The gate structures may be etched using suitable etching processes, such as isotropic etching processes (e.g., wet etching processes), anisotropic etching processes (e.g., dry etching processes), multiple processes or combinations thereof, or the like, to form the recesses 105. The gate structures may be etched by etching processes having good etch selectivity to the materials of the gate structures with respect to materials of the protection layer 95 or the first ILD 96 and the first CESL 94. As such, the gate structures may be etched back without significantly etching the protection layer 95 or the first ILD 96 and the first CESL 94. In some embodiments, the first spacers 81 and the second spacers 83 may be etched back simultaneously with the gate structures. In the embodiment illustrated in FIG. 15B, the gate structures have planar top surfaces and the first spacers 81 and the second spacers 83 have diagonal top surfaces with the top surfaces of the first spacers 81 and the second spacers 83 being above the top surfaces of the gate structures. In the embodiment illustrated in FIG. 15C, the gate structures, the first spacers 81, and the second spacers 83 have planar top surfaces and are level with one another. In some embodiments, the gate structures, the first spacers 81, and the second spacers 83 may have flat surfaces, planar surfaces, rounded or curved surfaces, or the like and the top surfaces of the gate structures may be disposed above, level with, or below the top surfaces of the first spacers 81 and the second spacers 83.

In FIGS. 16A through 16D, a barrier layer 103 is formed. The barrier layer 103 may be deposited in the recesses 105, along top surfaces of the gate electrodes 102, the gate dielectric layers 100, the first spacers 81, and the second spacers 83 and along side surfaces of the first CESL 94. The barrier layer 103 may further be deposited along top surfaces of the protection layer 95 (illustrated in FIGS. 16C and 16D) or the first ILD 96 and the first CESL 94 (illustrated in FIG. 16B). In some embodiments, the barrier layer 103 may be formed of a dielectric material, such as a nitride-based material. For example, the barrier layer 103 may include silicon nitride (SiN), silicon oxygen nitride (SiON), silicon carbon nitride (SiCN), silicon oxygen carbon nitride (SiOCN), combinations or multiple layers thereof, or the like. The barrier layer 103 may be deposited by PVD, CVD, ALD, spin-on coating, or the like.

The barrier layer 103 may be formed of a material that improves the selectivity of a subsequent deposition process. For example, a metal layer (such as the metal layer 104, discussed below with respect to FIGS. 18A through 18D) may be subsequently deposited over the gate structures adjacent to the barrier layer 103. Some material residue, such as a high-k material residue, may remain on top surfaces of the first spacers 81 and the second spacers 83 after the gate structures, the first spacers 81, and the second spacers 83 are etched back. For example, material residue from the gate dielectric layers 100, such as silicon oxide ($SiO_x$), hafnium oxide ($HfO_x$), zirconium oxide ($ZrO_x$), or the like may remain over the first spacers 81, and the second spacers 83 after the etch-back process. Forming the barrier layer 103 of the above-described materials and covering the high-k material residue with the barrier layer 103 prevents the subsequently deposited metal layer from being deposited in undesired positions (such as over the high-k material residue), improves the selectivity of the deposition of the metal layer, reduces leakage, reduces parasitic capacitance, reduces device defects, and improves device performance.

Figure 16C:
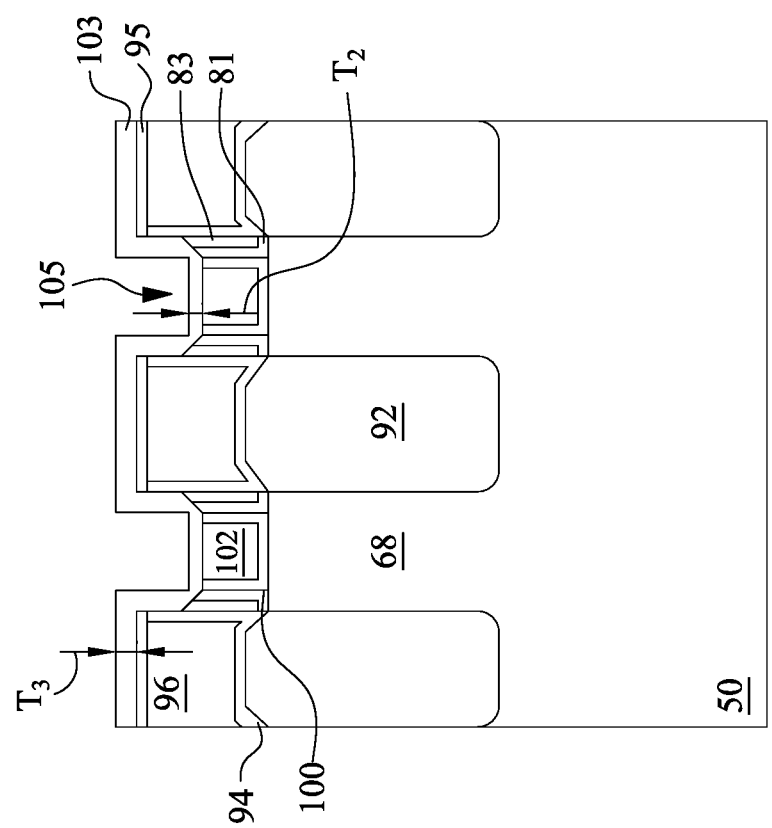
Figure 16D:
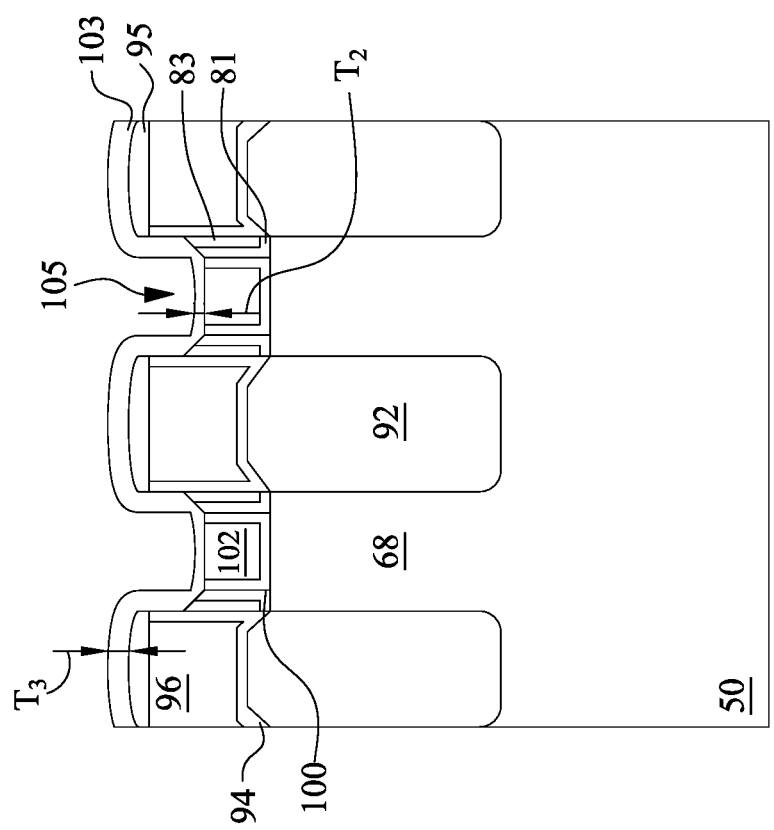

The barrier layer 103 may be deposited to a thickness ranging from about 1 nm to about 5 nm. In some embodiments, the barrier layer 103 may have a thickness $T_2$ within the recesses 105, such as on top surfaces of the gate structures, the first spacers 81, and the second spacers 83 and on side surfaces of the first CESL 94. The barrier layer 103 may have a thickness $T_3$ on top surfaces of the protection layer 95 or the first ILD 96 and the first CESL 94 that is greater than the thickness $T_2$. In some embodiments, the barrier layer 103 may have the thickness $T_3$ on the side surfaces of the first CESL 94. The thickness $T_2$ may range from about 1 nm to about 5 nm and the thickness $T_3$ may range from about 1 nm to about 5 nm. As illustrated in FIGS. 16B through 16D, side surfaces of the barrier layer 103 may be aligned with side surfaces of the first spacers 81 and the second spacers 83. Process parameters for the deposition of the barrier layer 103 may be controlled in order to control the thickness of the barrier layer 103 deposited within the recesses 105 and outside the recesses 105. For example, the barrier layer 103 may be deposited using precursors such as dichlorosilane ($H_2SiCl_2$, DCS), diiodosilane ($H_2I_2Si$), combinations thereof, or the like; at a temperature ranging from about 200° C. to about 600° C.; and a pressure ranging from about 2 Torr to about 25 Torr. Forming the barrier layer 103 to the prescribed thicknesses allows for the barrier layer 103 to be selectively removed from over the gate structures, while remaining along top surfaces of the first spacers 81 and the second spacers 83, along side surfaces of the first CESL 94, and along top surfaces of the protection layer 95 or the first ILD 96 and the first CESL 94. This improves the selectivity of the deposition of the metal layer, reduces leakage, reduces parasitic capacitance, reduces device defects, and improves device performance.

Figure 17B:
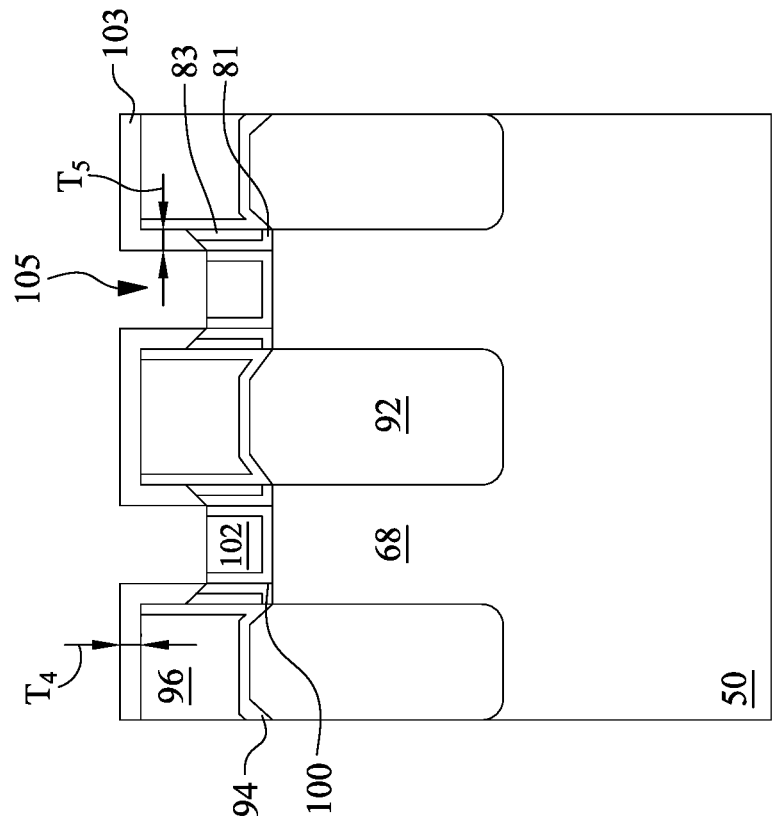
Figure 17A:
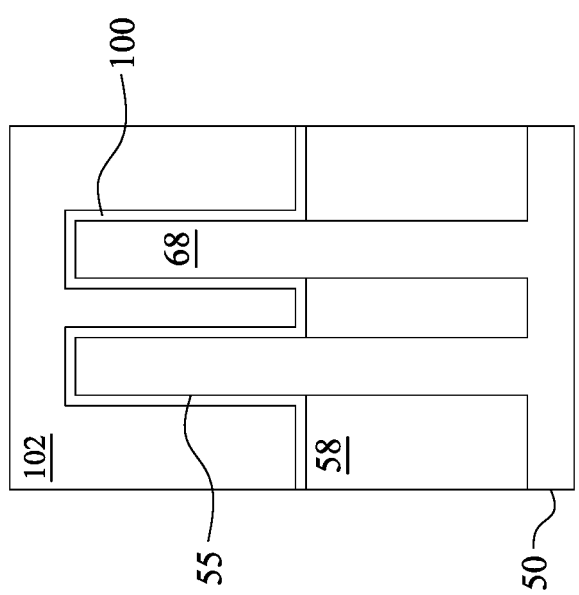
Figure 17C:
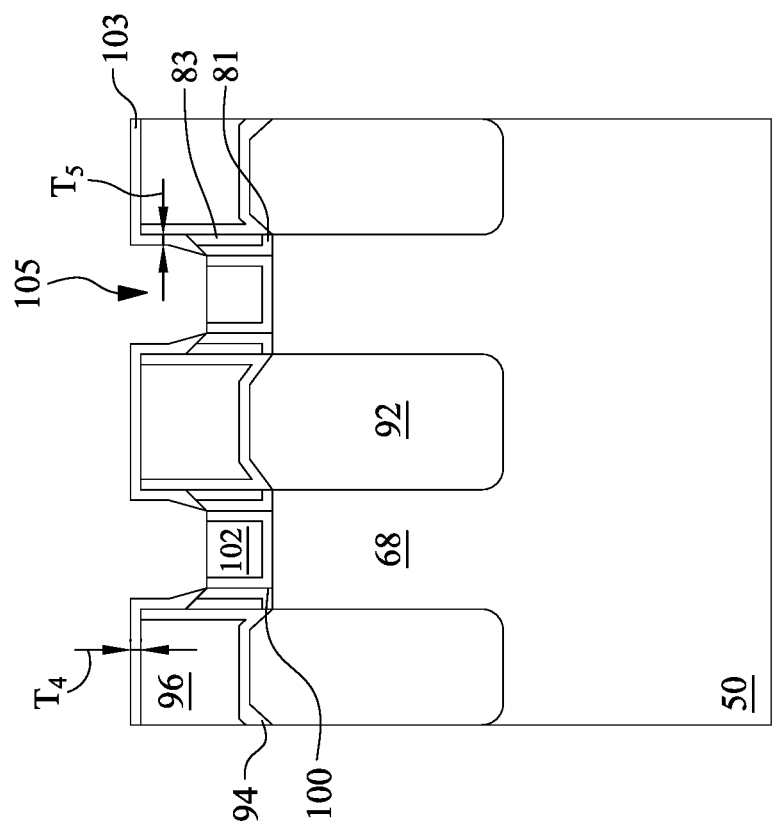

In FIGS. 17A through 17C, the barrier layer 103 is etched to expose top surfaces of the gate structures. The barrier layer 103 may be etched using suitable etching processes, such as isotropic etching processes (e.g., wet etching processes), anisotropic etching processes (e.g., dry etching processes), multiple processes or combinations thereof, or the like. In some embodiments, the etch process used to etch the barrier layer 103 may be referred to as a silicon nitride breakthrough etch or SiN BT. In some embodiments, the suitable etching processes may include a dry etching process (e.g., a plasma process) performed using an etching gas comprising fluoromethane (CH3F), argon (Ar), helium (He), oxygen ($O_2$), combinations thereof, or the like. As illustrated in FIGS. 17A through 17C, the barrier layer 103 may be etched to expose the gate structures, while the barrier layer 103 remains along surfaces of the first spacers 81, the second spacers 83, the first CESL 94, and the first ILD 96. Process parameters for the etching processes may be controlled in order to etch portions of the barrier layer 103 covering top surfaces of the gate structures at a faster rate than portions of the barrier layer 103 covering side surfaces of the first CESL 94 and portions of the barrier layer 103 covering top surfaces of the first CESL 94 and the first ILD 96. The etching processes may thin the portions of the barrier layer 103 remaining on the first spacers 81, the second spacers 83, the first CESL 94, and the first ILD 96. For example, following the etching processes, a thickness T4 of the barrier layer 103 over top surfaces of the first CESL 94 and the first ILD 96 may range from about 1 nm to about 5 nm and a thickness T5 of the barrier layer 103 over side surfaces of the first CESL 94 may range from about 1 nm to about 5 nm. As illustrated in FIGS. 17B and 17C, side surfaces of the barrier layer 103 may be aligned with side surfaces of the first spacers 81 and the second spacers 83. In the embodiment illustrated in FIG. 17B, portions of the barrier layer 103 on the top surfaces of the first CESL 94 and the first ILD 96 have substantially the same thickness as portions of the barrier layer 103 on the side surfaces of the first CESL 94. As illustrated in FIG. 17C, portions of the barrier layer 103 in the recesses 105 may have tapered sidewalls that narrow in a direction away from the substrate 50 and portions of the barrier layer 103 on the top surfaces of the first CESL 94 and the first ILD 96 have thicknesses less than portions of the barrier layer 103 on the side surfaces of the first CESL 94.

Etching the barrier layer 103 such that portions of the barrier layer 103 remain on the first spacers 81, the second spacers 83, the first CESL 94, and the first ILD 96, while the gate structures are exposed improves the selectivity of a subsequent deposition process. For example, as will be discussed in greater detail below, a metal layer (such as the metal layer 104, discussed below with respect to FIGS. 18A through 18D) may be subsequently selectively deposited over the gate structures adjacent to the barrier layer 103, without being deposited on the first spacers 81, the second spacers 83, the first CESL 94, or the first ILD 96. This improves the selectivity of the deposition of the metal layer, reduces leakage, reduces parasitic capacitance, reduces device defects, and improves device performance.

Figure 18B:
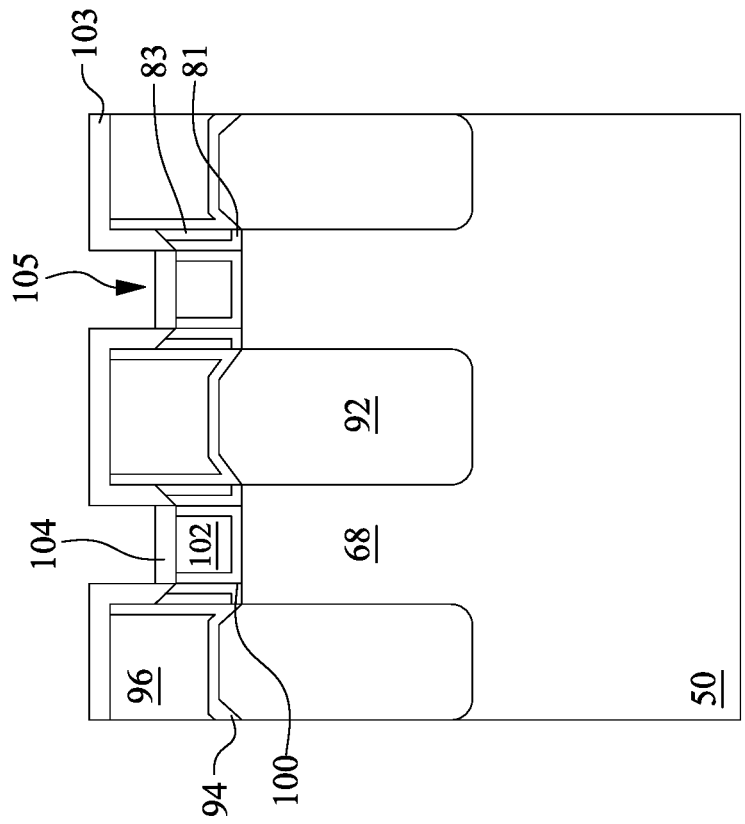
Figure 18A:
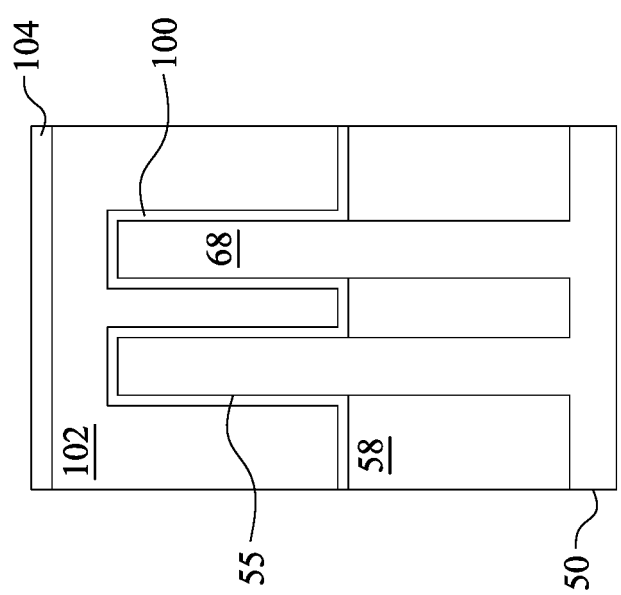
Figure 18C:
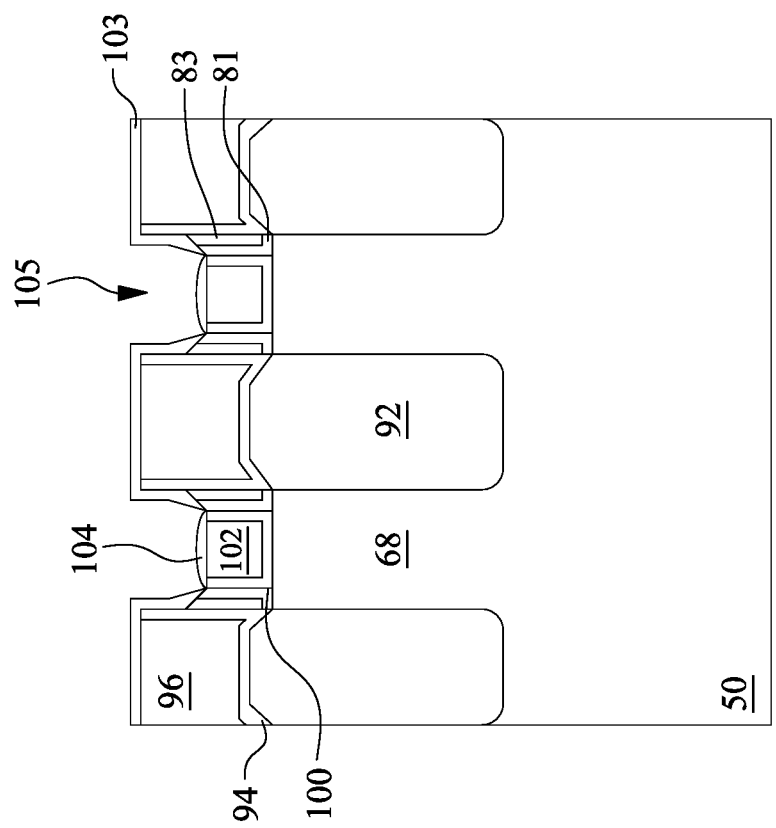
Figure 18D:
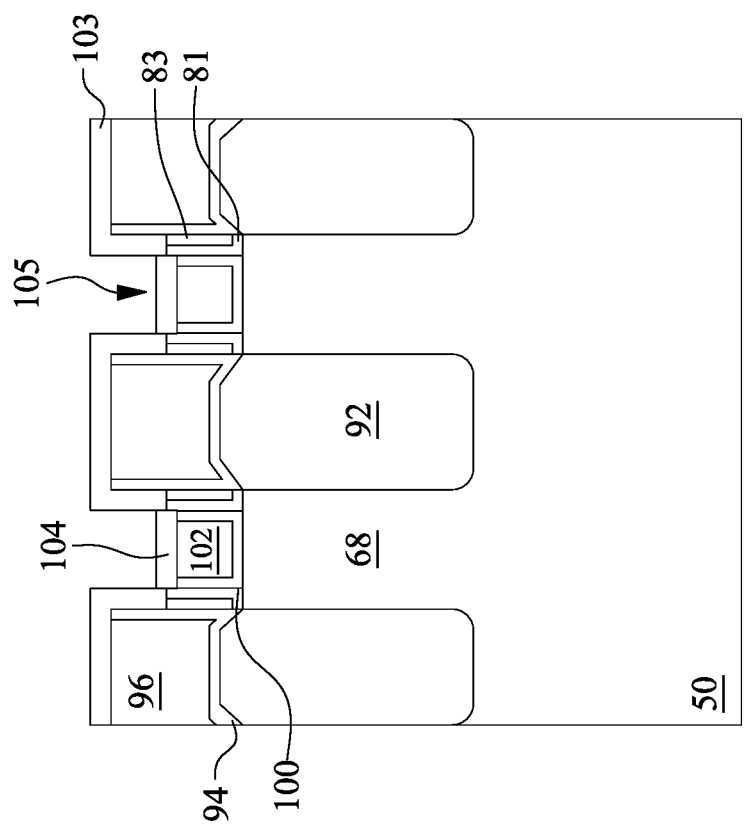

In FIGS. 18A through 18D, a metal layer 104 is deposited over the gate structures. In some embodiments, the metal layer 104 may be referred to as a conductive layer, an etch stop layer, or the like. As illustrated in FIGS. 18B through 18D, the metal layer 104 may have widths equal to widths of the gate structures and may have side surfaces aligned with side surfaces of the gate structures (such as side surfaces of the gate dielectric layers 100). The metal layer 104 may include tungsten (such as fluorine-free tungsten (FFW)), titanium, platinum, combinations or multiple layers thereof, or the like. The metal layer 104 may be deposited from chloride-based precursors (such as metal chloride precursors), fluoride-based precursors, or the like, which are able to be selectively deposited on the gate structures without being deposited on the barrier layer 103. In some embodiments, the precursors for depositing the metal layer 104 may include tungsten chloride ($WCl_5$), titanium chloride ($TiCl_5$), platinum chloride ($PtCl_6$), tungsten fluoride ($WF_6$), combinations or multiples thereof, or the like. The metal layer 104 may be deposited at a temperature ranging from about 150° C. to about 580° C. and a pressure ranging from about 0.1 Torr to about 5.0 Torr. In some embodiments, the metal layer 104 may be deposited at a temperature greater than about 450° C. and a pressure ranging from about 20 Torr to about 30 Torr. The metal layer 104 may be deposited by CVD, ALD, or the like. The metal layer 104 may be formed of a conductive material and may act as an etch stop layer and may be used to tune the contact resistance of gate contacts formed on the gate structures. As discussed previously, forming the barrier layer 103 prior to depositing the metal layer 104 increases the selectivity of the deposition process used to deposit the metal layer 104, such that the metal layer 104 is deposited on the gate structures without being deposited along the first spacers 81, the second spacers 83, the first CESL 94, or the first ILD 96 covered by the barrier layer 103. This improves the selectivity of the deposition of the metal layer 104, reduces leakage, reduces parasitic capacitance, reduces device defects, and improves device performance.

FIGS. 18B and 18D illustrate embodiments in which the metal layer 104 is deposited with a planar top surface. Further in FIG. 18D, in the etching process discussed above with respect to FIGS. 15A through 15C, top surfaces of the gate structures may be etched below top surfaces of the first spacers 81 and the second spacers 83, and the metal layer 104 may be deposited over the resulting structure. FIG. 18C illustrates an embodiment in which the metal layer 104 is deposited with a rounded, convex top surface. In some embodiments, the metal layer 104 may be deposited with a flat top surface, a concave top surface, or a convex top surface.

Figure 19A:
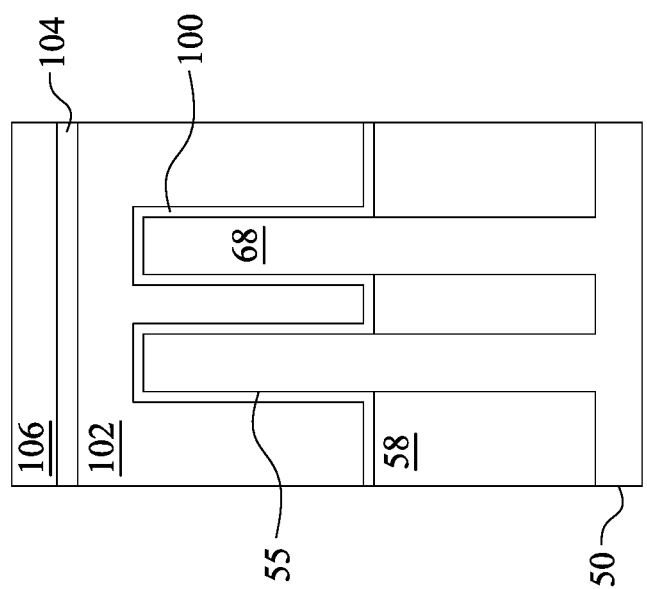
Figure 19B:
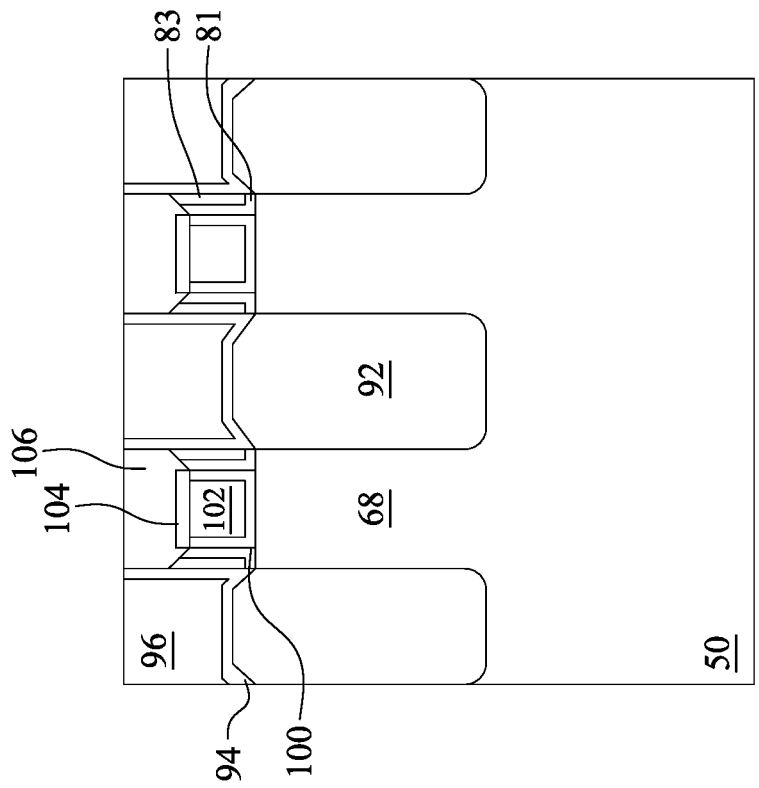
Figure 19C:
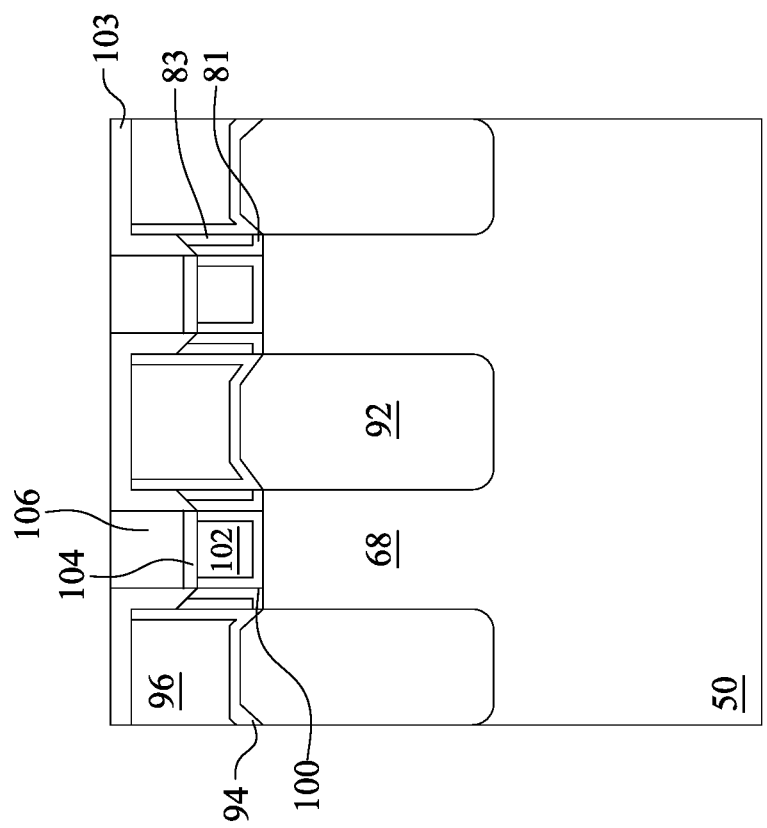

In FIGS. 19A through 19C, a second ILD 106 is formed filling the recesses 105. In some embodiments, the barrier layer 103 may be removed before forming the second ILD 106. The barrier layer 103 may be removed using suitable etching processes, such as isotropic etching processes (e.g., wet etching processes), anisotropic etching processes (e.g., dry etching processes), multiple processes or combinations thereof, or the like. The second ILD 106 may be formed of materials and by processes the same as or similar to those discussed above with respect to the first ILD 96. The second ILD 106 may be formed of materials and by methods the same as or similar to those used to form the first ILD 96, discussed above with respect to FIGS. 11A and 11B. After the filling of the recesses 105, a planarization process, such as a CMP, is performed to remove excess portions of the second ILD 106, which excess portions are over top surfaces of the first ILD 96 and the first CESL 94 (illustrated in FIG. 19B), or over top surfaces of the barrier layer 103 (illustrated in FIG. 19C). In some embodiments, the second ILD 106 may be formed of silicon nitride or the like.

In FIGS. 20A and 20B, a third ILD 108 is formed over the first ILD 96, the first CESL 94, and the second ILD 106. In some embodiments, the third ILD 108 is a flowable film formed by FCVD. In some embodiments, the third ILD 108 is formed of a dielectric material such as PSG, BSG, BPSG, USG, or the like, and may be deposited by any suitable method, such as CVD, PECVD, or the like. In some embodiments, the dielectric materials for the third ILD 108 may include silicon oxide, silicon nitride, silicon oxynitride, or the like.

Figure 21B:
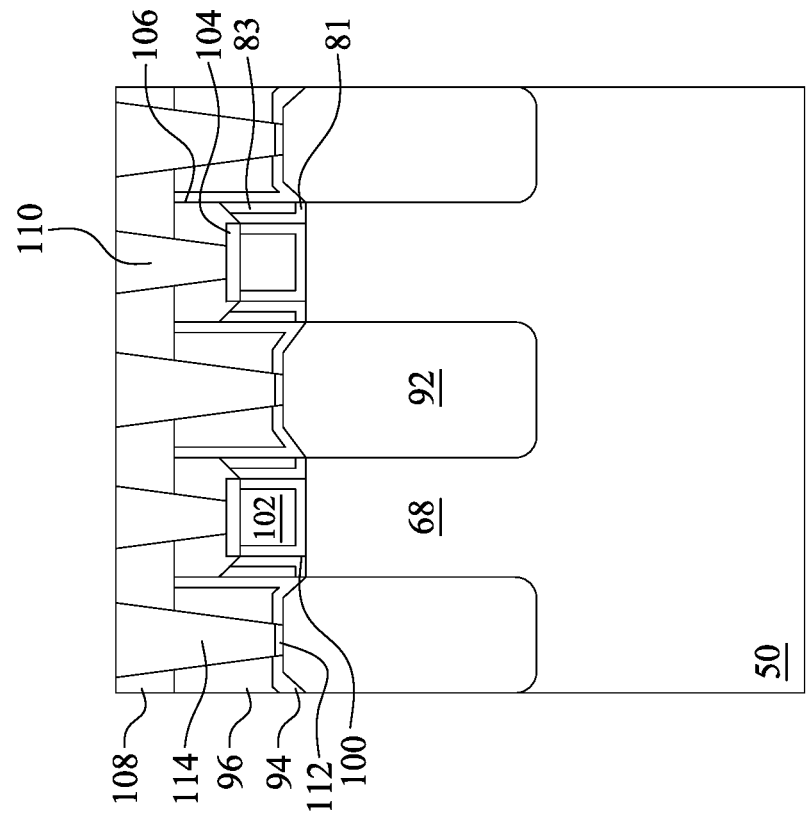
Figure 21A:
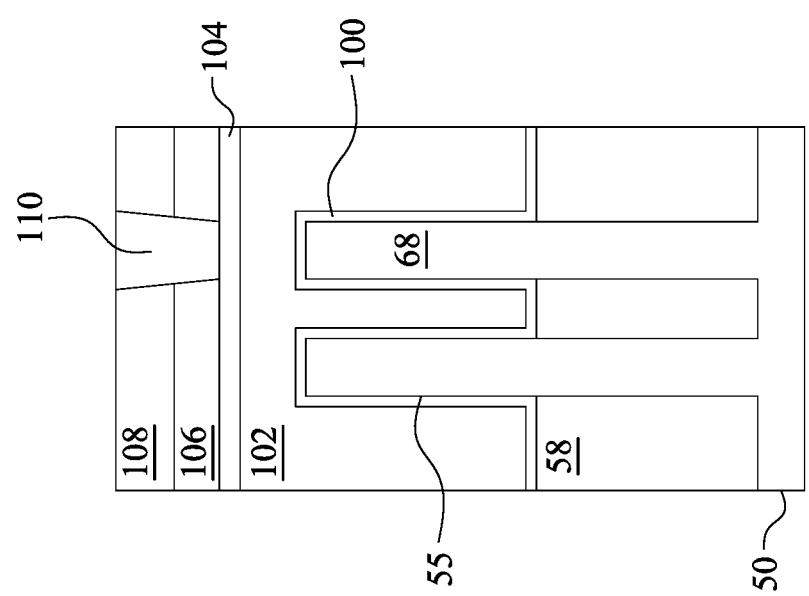

In FIGS. 21A and 21B, gate contacts 110 are formed through the third ILD 108 and the second ILD 106 and source/drain contacts 114 are formed through the third ILD 108, the first ILD 96, and the first CESL 94. Openings for the source/drain contacts 114 are formed through the third ILD 108, the first ILD 96, and the first CESL 94 and openings for the gate contacts 110 are formed through the third ILD 108 and the second ILD 106. The openings may be formed using acceptable photolithography and etching techniques. In some embodiments, after the openings for the source/drain contacts 114 are formed through the third ILD 108, the first ILD 96, and the first CESL 94, silicide regions 112 are formed over the epitaxial source/drain regions 92. The silicide regions 112 may be formed by first depositing a metal (not separately illustrated) capable of reacting with the semiconductor materials of the underlying epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the silicide regions 112.

A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the third ILD 108. The remaining liner and conductive material form the source/drain contacts 114 and the gate contacts 110 in the openings. The source/drain contacts 114 are electrically coupled to the epitaxial source/drain regions 92 through the silicide regions 112 and the gate contacts 110 are electrically coupled to the gate electrodes 102 through the metal layer 104. The source/drain contacts 114 and the gate contacts 110 may be formed in different processes, or may be formed in the same process. Although shown as being formed in the same cross-sections, it should be appreciated that each of the source/drain contacts 114 and the gate contacts 110 may be formed in different cross-sections, which may avoid shorting of the contacts.

Embodiments achieve various advantages. For example, forming the barrier layer 103 before forming the metal layer 104 improves the selectivity of the process used to deposit the metal layer 104. This prevents material of the metal layer 104 being deposited in undesired areas, such as along surfaces of the first spacers 81, the second spacers 83, the first CESL 94, the first ILD 96, and the protection layer 95. This also reduces leakage, reduces parasitic capacitance, reduces device defects, and improves device performance.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments.

In accordance with an embodiment, a semiconductor device includes a channel region over a semiconductor substrate; a gate structure over the channel region; a gate spacer adjacent the gate structure; a first dielectric layer adjacent the gate spacer; a barrier layer contacting a top surface of the gate spacer and a side surface of the first dielectric layer, the barrier layer including a nitride; and a metal layer over the gate structure adjacent the barrier layer, the metal layer having a first width equal to a second width of the gate structure. In an embodiment, the metal layer includes tungsten, titanium, or platinum. In an embodiment, the semiconductor device further includes a first interlayer dielectric (ILD) over the first dielectric layer, the barrier layer extending along a top surface of the first ILD and a top surface of the first dielectric layer. In an embodiment, the barrier layer has tapered sidewalls that narrow in a direction away from the semiconductor substrate, and a thickness of the tapered sidewalls is greater than a thickness of a top portion of the barrier layer extending along top surface of the first ILD and the top surface of the first dielectric layer. In an embodiment, the semiconductor device further includes a first interlayer dielectric (ILD) over the first dielectric layer; and a protection layer extending along a top surface of the first ILD and a top surface of the first dielectric layer, the barrier layer extending along a top surface and a side surface of the protection layer. In an embodiment, the semiconductor device further includes a first interlayer dielectric (ILD) over the metal layer adjacent the barrier layer, a top surface of the first ILD being level with a top surface of the barrier layer. In an embodiment, a top surface of the gate spacer is above a top surface of the gate structure, and the metal layer extends from below the top surface of the gate spacer to above the top surface of the gate spacer.

In accordance with another embodiment, a semiconductor device includes a fin extending from a semiconductor substrate; a gate structure over the fin; a gate spacer adjacent the gate structure; a conductive layer over the gate structure, sidewalls of the conductive layer being aligned with sidewalls of the gate structure; and a first interlayer dielectric (ILD) over the gate spacer and the conductive layer, the first ILD contacting a side surface and a top surface of the conductive layer. In an embodiment, a top surface of the gate spacer is level with a top surface of the gate structure. In an embodiment, a top surface of the gate spacer is above a top surface of the gate structure, and a top surface of the conductive layer is above the top surface of the gate spacer. In an embodiment, the semiconductor device further includes a contact etch stop layer (CESL) extending along a side surface of the gate spacer and a side surface of the first ILD. In an embodiment, the semiconductor device further includes a second ILD adjacent the CESL, a top surface of the second ILD being level with a top surface of the CESL and a top surface of the first ILD. In an embodiment, the semiconductor device further includes a second ILD adjacent the CESL; and a protection layer over the second ILD and the CESL, a top surface of the protection layer being level with a top surface of the first ILD.

In accordance with yet another embodiment, a method includes forming a fin structure over a substrate; forming a gate structure over the fin structure; forming a gate spacer adjacent to the gate structure; depositing a barrier layer over the gate structure and the gate spacer; etching the barrier layer to expose a top surface of the gate structure; and selectively depositing a conductive layer over the top surface of the gate structure, the conductive layer being separated from the gate spacer by the barrier layer. In an embodiment, the method further includes removing the barrier layer after selectively depositing the conductive layer. In an embodiment, a precursor for the conductive layer includes a metal chloride. In an embodiment, the barrier layer includes a nitride. In an embodiment, the method further includes forming a contact etch stop layer over the gate structure and the gate spacer; and forming a first interlayer dielectric layer over the contact etch stop layer, the barrier layer being deposited along a top surface of the contact etch stop layer, a top surface of the first interlayer dielectric layer, and a side surface of the contact etch stop layer. In an embodiment, the barrier layer is deposited with a first thickness over a top surface of the first interlayer dielectric layer, and the barrier layer is deposited with a second thickness over the gate structure less than the first thickness. In an embodiment, a portion of the barrier layer over the first interlayer dielectric layer is etched at a first etch rate, and a portion of the barrier layer over the gate structure is etched at a second etch rate greater than the first etch rate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a fin structure over a substrate;
    forming a gate structure over the fin structure;
    forming a gate spacer adjacent to the gate structure;
    depositing a barrier layer over the gate structure and the gate spacer;
    etching the barrier layer to expose a top surface of the gate structure; and
    selectively depositing a conductive layer over the top surface of the gate structure, wherein the conductive layer is separated from the gate spacer by the barrier layer.

2. The method of claim 1, further comprising removing the barrier layer after selectively depositing the conductive layer.

3. The method of claim 1, wherein a precursor for depositing the conductive layer comprises a metal chloride.

4. The method of claim 1, wherein the barrier layer comprises a nitride.

5. The method of claim 1, further comprising:
    forming a contact etch stop layer over the gate structure and the gate spacer; and
    forming a first interlayer dielectric layer over the contact etch stop layer, wherein the barrier layer is deposited along a top surface of the contact etch stop layer, a top surface of the first interlayer dielectric layer, and a side surface of the contact etch stop layer.

6. The method of claim 5, wherein the barrier layer is deposited with a first thickness over the top surface of the first interlayer dielectric layer, and wherein the barrier layer is deposited with a second thickness over the gate structure, the second thickness being less than the first thickness.

7. The method of claim 5, wherein a portion of the barrier layer over the first interlayer dielectric layer is etched at a first etch rate, and wherein a portion of the barrier layer over the gate structure is etched at a second etch rate greater than the first etch rate.

8. A method comprising:
    forming a fin structure over a substrate;
    forming a first gate structure over the fin structure;
    forming a gate spacer adjacent to the first gate structure;
    forming one or more first dielectric layers adjacent the first gate structure and the gate spacer;
    removing the first gate structure to form a first recess;
    forming a second gate structure in the first recess, upper surfaces of the second gate structure and the gate spacer being lower than an upper surface of the one or more first dielectric layers to form a second recess;
    depositing a barrier layer along sidewalls of the second recess, wherein an upper surface of the second gate structure is exposed; and
    depositing a conductive layer over the upper surface of the second gate structure, wherein the conductive layer is separated from the gate spacer by the barrier layer.

9. The method of claim 8, wherein forming the second gate structure comprises:
    recessing the second gate structure below the upper surface of the one or more first dielectric layers.

10. The method of claim 8, wherein after forming the second gate structure, an upper surface of the second gate structure is lower than an upper surface of the gate spacer.

11. The method of claim 8, wherein a thickness of the barrier layer decreases as the barrier layer extends away from the second gate structure.

12. The method of claim 8, wherein an upper surface of the conductive layer is convex.

13. The method of claim 8, wherein the conductive layer comprises tungsten, titanium, or platinum.

14. The method of claim 8, further comprising:
    forming a second dielectric layer over the conductive layer, wherein an upper surface of the second dielectric layer is level with an upper surface of the one or more first dielectric layers.

15. The method of claim 8, further comprising:
removing the barrier layer from the sidewalls of the second recess after forming the conductive layer.

16. A method comprising:
forming a fin structure over a substrate;
forming a dummy gate structure over the fin structure;
forming a gate spacer adjacent to the dummy gate structure;
forming a first dielectric layer adjacent to the gate spacer;
removing the dummy gate structure to form a first recess;
forming a replacement gate structure in the first recess;
recessing the replacement gate structure and the gate spacer to form a second recess;
forming a barrier layer along sidewalls and a bottom surface of the second recess;
etching the barrier layer to expose an upper surface of the replacement gate structure, wherein the barrier layer remains along the sidewalls of the second recess;
depositing a conductive layer over the upper surface of the replacement gate structure, wherein an upper surface of the gate spacer is covered by the barrier layer while depositing the conductive layer; and
forming a second dielectric layer over the conductive layer in the second recess.

17. The method of claim 16, further comprising:
removing the barrier layer prior to forming the second dielectric layer.

18. The method of claim 17, wherein the second dielectric layer extends along sidewalls of the conductive layer.

19. The method of claim 16, wherein etching the barrier layer tapers a thickness of the barrier layer, wherein a thickness of the barrier layer increases as the barrier layer extends from a top of the second recess towards a bottom of the second recess.

20. The method of claim 16, wherein the upper surface of the gate spacer is sloped after recessing the replacement gate structure and the gate spacer.

\* \* \* \* \*